(12) United States Patent
Lee et al.

(10) Patent No.: US 7,902,597 B2
(45) Date of Patent: Mar. 8, 2011

(54) TRANSISTORS WITH LATERALLY EXTENDED ACTIVE REGIONS AND METHODS OF FABRICATING SAME

(75) Inventors: Sung-Sam Lee, Yongin-si (KR); Min-Hee Cho, Suwon-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 407 days.

(21) Appl. No.: 12/025,877

(22) Filed: Feb. 5, 2008

(65) Prior Publication Data

US 2008/0157194 A1    Jul. 3, 2008

Related U.S. Application Data

(63) Continuation-in-part of application No. 11/387,029, filed on Mar. 22, 2006, now Pat. No. 7,470,588.

(30) Foreign Application Priority Data

Feb. 26, 2007   (KR) ........................ 10-2007-0019088

(51) Int. Cl.
H01L 21/336 (2006.01)
(52) U.S. Cl. .................. 257/330; 438/272; 257/E21.428
(58) Field of Classification Search .................. 257/330, 257/E21.428; 438/272
See application file for complete search history.

(56) References Cited

U.S. PATENT DOCUMENTS

| | | | |
|---|---|---|---|
| 5,895,253 A | 4/1999 | Akram | |
| 6,232,202 B1 | 5/2001 | Hong | |
| 6,476,444 B1 | 11/2002 | Min | |
| 6,844,591 B1 | 1/2005 | Tran | |
| 7,141,486 B1 | 11/2006 | Rossi et al. | |
| 7,157,770 B2 | 1/2007 | Park et al. | |
| 2001/0023960 A1 | 9/2001 | Soga et al. | |
| 2001/0036705 A1 | 11/2001 | Nishida et al. | |
| 2002/0039818 A1 | 4/2002 | Lee | |
| 2003/0085435 A1 | 5/2003 | Wang | |
| 2003/0098493 A1* | 5/2003 | Marty et al. | 257/510 |
| 2006/0049455 A1* | 3/2006 | Jang et al. | 257/330 |
| 2006/0113590 A1 | 6/2006 | Kim et al. | |

FOREIGN PATENT DOCUMENTS

| | | |
|---|---|---|
| JP | 58032430 | 2/1983 |
| JP | 11307627 | 11/1999 |
| JP | 2000049296 | 2/2000 |
| JP | 2002353445 | 12/2002 |
| KR | 1020000060693 A | 10/2000 |
| KR | 1020010081253 A | 8/2001 |
| KR | 1020030002364 A | 1/2003 |
| KR | 1020050018187 A | 2/2005 |
| KR | 1020060077543 A | 7/2006 |
| KR | 1020060099179 A | 9/2006 |
| KR | 1020060102878 A | 9/2006 |

* cited by examiner

*Primary Examiner* — Steven J Fulk
(74) *Attorney, Agent, or Firm* — Volentine & Whitt, PLLC

(57) ABSTRACT

A transistor and method of fabricating the transistor are disclosed. The transistor is disposed in an active region of a substrate defined by an isolation region and includes a gate electrode and associated source/drain regions. The isolation region includes an upper isolation region and a lower isolation region, wherein the upper isolation region is formed with sidewalls having, at least in part, a positive profile.

8 Claims, 28 Drawing Sheets

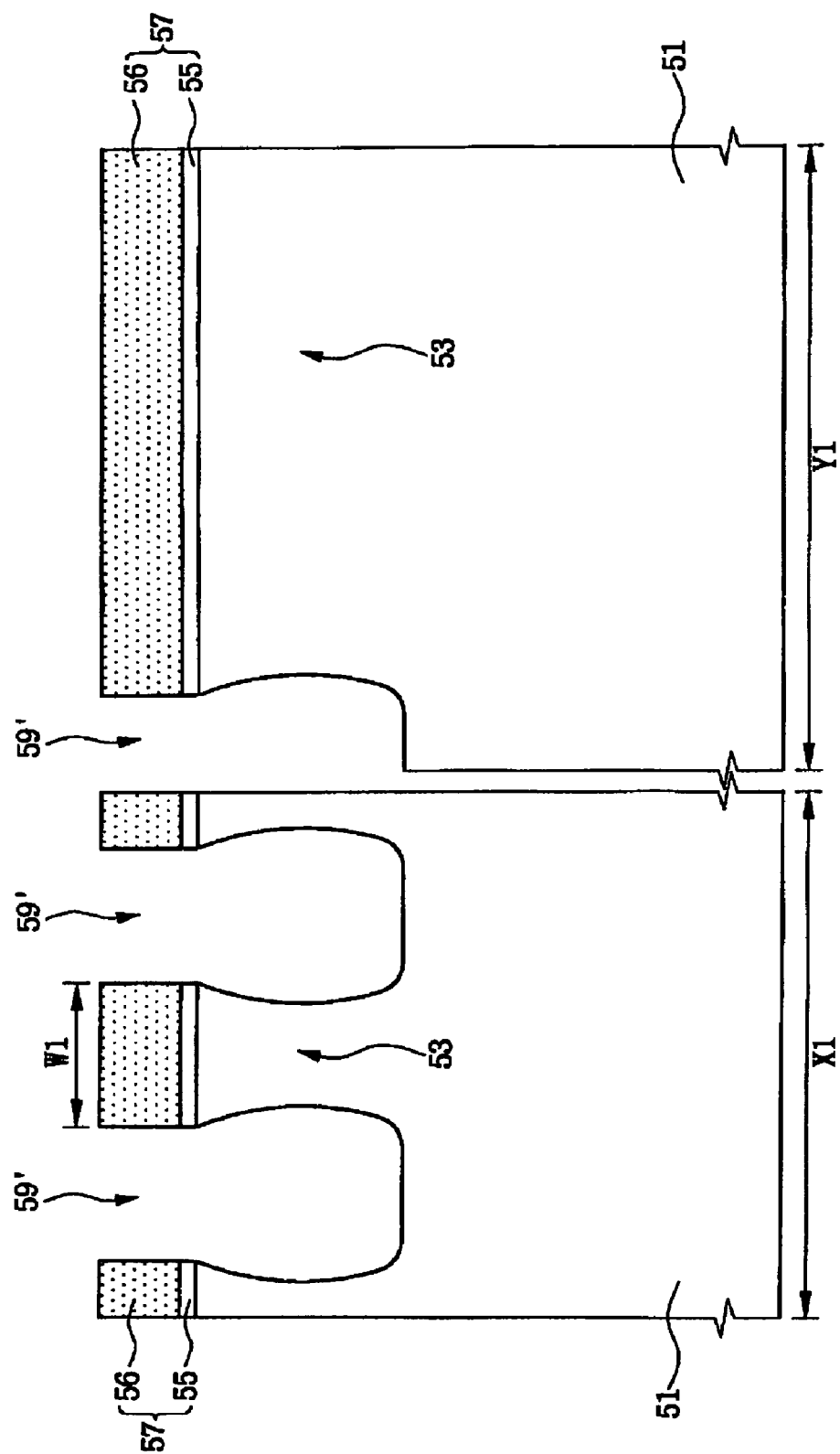

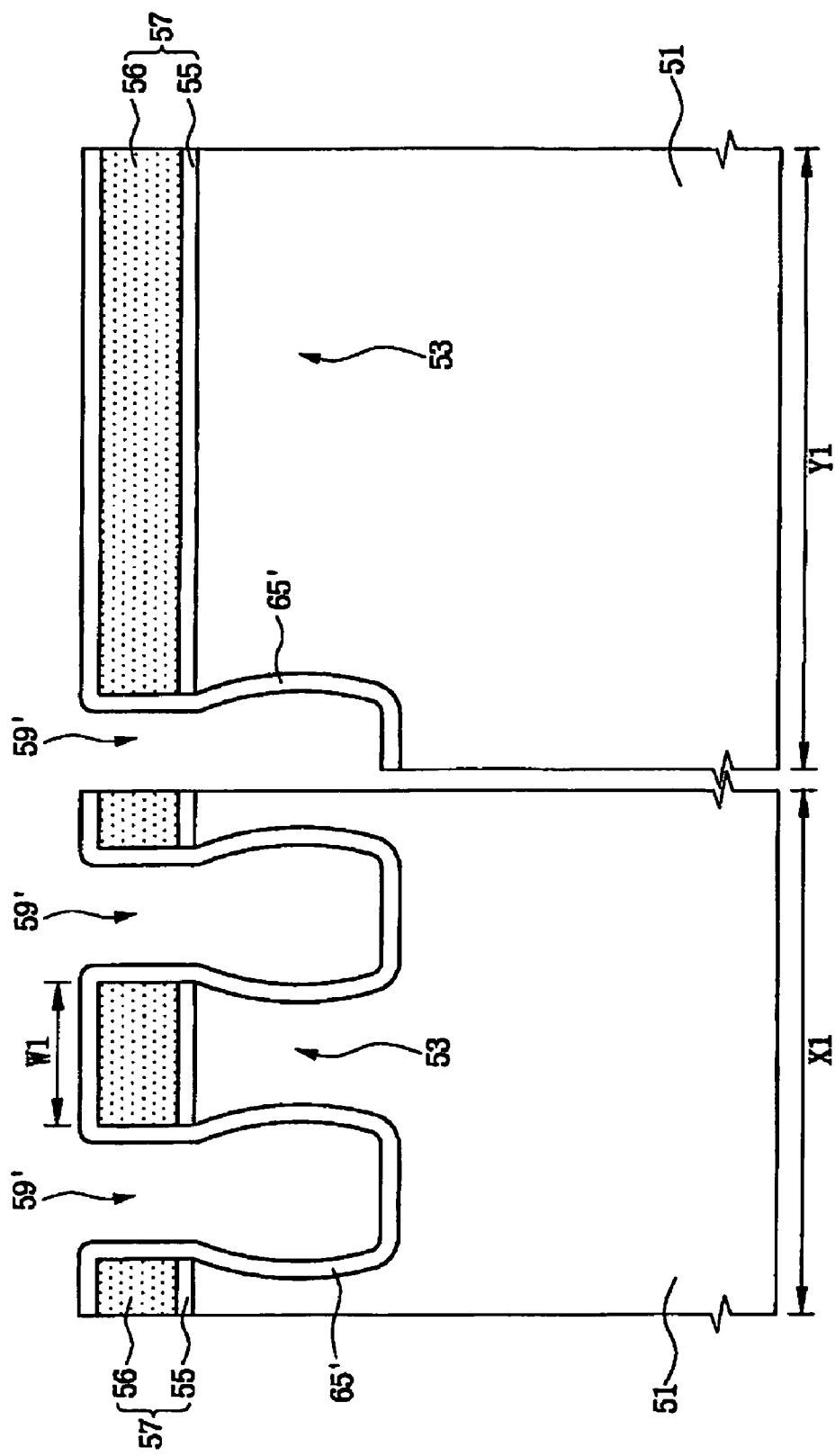

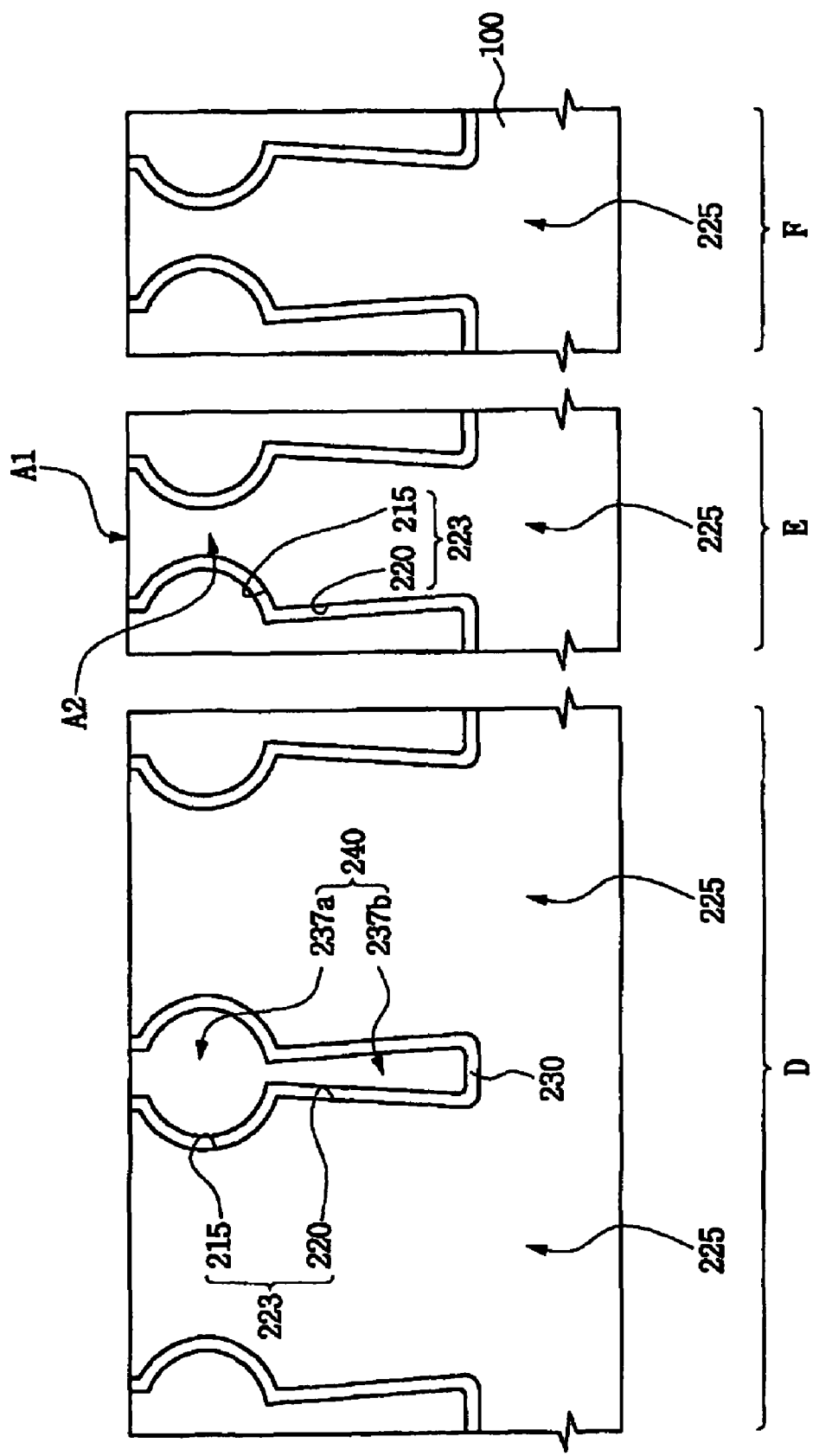

TRANSISTORS WITH LATERALLY EXTENDED ACTIVE REGIONS AND METHODS OF FABRICATING SAME

CROSS-REFERENCE TO RELATED APPLICATION

This application is a Continuation-In-Part to pending U.S. application Ser. No. 11/387,029 filed Mar. 22, 2006. This application also claims priority under 35 U.S.C. §119 to Korean Patent Application No. 10-2007-0019088 filed Feb. 26, 2007, the subject matter of which is hereby incorporated by reference.

BACKGROUND OF THE INVENTION

1. Field of the Invention

The present invention relates to semiconductor devices and methods of fabricating same. More particularly, the invention relates to semiconductor devices having recessed gate electrodes and methods of fabricating same.

2. Discussion of Related Art

As electronic products employing semiconductor devices have become increasingly thin, lightweight, and compact, semiconductor devices used in such produce generally have been required to become more densely integrated. Accordingly, research for reducing the two-dimensional size of transistors has been ongoing.

Reduction in transistor size has resulted in the reduction of transistor channel length and channel width. However, the drive current provided by a transistor is inversely proportional to its channel length, and generally proportional to its channel width. Thus, reduction in channel length may increase drive current and response speed. In contrast, reduction in channel length may cause problems, such as punch-through. Consequently, there is a continuing need for design and fabrication approaches that minimize the two-dimensional size of transistors while at the same time providing an effective channel length.

One type of transistor known as a recess channel array transistor (RCAT) accomplishes these two objectives. The RCAT allows reduction in two-dimensional size while effectively increasing channel length. To fabricate a RCAT, a gate trench is first formed in an active region of a constituent substrate. An insulated gate electrode is formed to cross the active region and fill the gate trench. In this manner, the depth of the gate trench increases the effective channel length.

Early RCATs were fabricated with a gate electrodes having planar shapes (i.e., shapes defined by linear geometries). See, for example U.S. Pat. No. 7,157,770, the subject matter of which his hereby incorporated by reference.

However, later RCAT designs departed from strictly planar shapes to include curved shapes (i.e., shapes defined in whole or in part by an arc). One of these design alternative is the spherical recess channel array transistor (SRCAT). The SRCAT like all RCAT designs increases the effective channel length. In the SRCAT, a planar upper gate trench is formed in an active region of a substrate. A curved lower gate trench is formed (e.g.,) in the shape of a flask below the upper planar gate trench. An insulated gate electrode is formed to cross the active region and fill the upper and lower gate trenches. The combined depth of the upper and lower gate trenches serves to increase the effective channel length of the transistor.

As noted above, reduction in channel width typically decreases the drive current provided by a transistor. Thus, channel width is designed in consideration of the drive current required for the operation of the semiconductor device incorporating the transistor. Accordingly, various design and fabrication techniques have been applied to extend the effective channel width.

FIG. 1 is a cross-sectional view of a conventional RCAT. The first region "1" of FIG. 1 shows a cross-section of the RCAT taken in a word line direction. The second region "2" of FIG. 1 is a cross-section of the RCAT taken in a bit line direction. Referring to FIG. 1, the conventional RCAT includes an isolation layer 16 defining an active region 13 within a semiconductor substrate 11. In the illustrated example, isolation layer 16 includes an insulating layer 15 formed on a sidewall oxide layer 14. A gate trench 17 is formed in active region 13. Gate trench 17 crosses active region 13 and partially exposes sidewalls of isolation layer 16. A gate electrode 19 is formed across active region 13. Gate electrode 19 has a descending gate electrode portion 19E extending into gate trench 17. A gate dielectric layer 18 is interposed between active region 13 and gate electrode 19. Gate dielectric layer 18 is also interposed between active region 13 and descending gate electrode portion 19E. Source/drain regions 21 and 23 are formed in active region 13 at respective sides of gate electrode 19.

The effective channel length "CL1" of the RCAT illustrated in FIG. 1 is relatively long compared to a conventional planar transistor because of the presence of gate trench 17. Accordingly, even when the two-dimensional size of the RCAT is reduced, a desirable effective channel length CL1 may be secured.

However, an effective channel width "CW1" of the RCAT illustrated in FIG. 1 is yet dependent on the size of active region 13, and active region 13 is defined by isolation layer 16. In the illustrated example, to reduce the two-dimensional size of the RCAT, it is advantageous to reduce active region 13 to the resolution limit of the photolithography process used to fabricate the transistor. However, reduction of active region 13 may cause the effective channel width CW1 to be reduced. In this case, the drive current provided by the RCAT will also be reduced.

The width of active region 13 should be increased to increase the effective channel width CW1. Yet, this approach works against the design objective of increasing integration density for an array of RCATs.

One technique for increasing the effective channel width of a transistor is described in published U.S. Patent Application No. 2003/0085345, the subject matter of which is hereby incorporated by reference. According to this technique, at least one recess region is formed in a channel length direction of an active region. An insulated gate electrode is formed across the recess regions. The recess regions act to extend the effective channel width of the transistor. Another informative technique for forming a transistor is described in U.S. Pat. No. 6,844,591, the subject matter of which is hereby incorporated by reference.

SUMMARY OF THE INVENTION

In one embodiment, the invention provides a transistor disposed on a substrate in relation to an isolation region, the transistor comprising; a gate electrode and associated source/drain regions, wherein the isolation region is disposed in the substrate to define an active region, the isolation region including an upper isolation region defining an upper active region and an lower isolation region defining a lower active region, wherein the lower active region has a width greater than the upper active region, and the upper isolation region is formed with sidewalls having, at least in part, a positive profile, the gate electrode extends through the upper active region into the lower active region, and the source/drain regions are disposed in the active region on respective sides of the gate electrode.

In a related aspect, the gate electrode may comprise an upper gate electrode extending through the upper active region and a lower gate electrode disposed at least in part in the lower active region, wherein the lower gate electrode has a width greater than the upper gate electrode.

In another embodiment, the invention provides a semiconductor memory device comprising; an array of memory cells and at least one peripheral circuit associated with the array, wherein each memory cell in the array comprises at least one lateral extended transistor, the lateral extended transistor comprising a gate electrode and associated source/drain regions, wherein each memory cell in the array is formed in an active region of a substrate defined by an isolation region, the isolation region including an upper isolation region defining an upper active region and an lower isolation region defining a lower active region, wherein the lower active region has a width greater than the upper active region, and the upper isolation region is formed with sidewalls having, at least in part, a positive profile, the gate electrode extends through the upper active region into the lower active region, and the source/drain regions are disposed in the active region on respective sides of the gate electrode.

In another embodiment, the invention provides a method of fabricating a transistor, the method comprising; forming an isolation trench in a substrate to define an active region, the isolation trench comprising an upper isolation trench having sidewalls including, at least in part, a negative profile and a lower isolation trench formed through a bottom surface of the upper isolation trench, wherein the lower isolation trench has a width less than or equal to a minimal width of the upper isolation trench, and wherein the upper isolation trench defines an upper active region in the active region and the lower isolation trench defines a lower active region in the active region having a width greater than or equal to the width of the upper active region, forming a gate electrode extending through the upper active region into the lower active region, and forming source/drain regions in the active region on respective sides of the gate electrode.

In a related aspect, the isolation trench may be formed by forming a hard mask pattern on the substrate, etching the substrate through the hard mask pattern using a wet etching process and/or a dry anisotropic etching process to form the upper isolation trench, forming a spacer on sidewalls of the upper isolation trench, selectively removing a portion of the spacer on a bottom surface of the upper isolation trench to expose a portion of the substrate, and etching the exposed portion of the substrate using an isotropic etching process to form the lower isolation trench.

In another embodiment, the invention provides a method of forming a recessed channel array transistor (RCAT) in an active region of a semiconductor substrate, the method comprising; forming a recessed channel region in the substrate to separate source/drain regions of the RCAT and define a channel between the source/drain regions, forming a gate electrode structure in the recessed channel region contacting the source/drain regions, separating the active region from an adjacent active region by forming an isolation trench in the substrate and filling the isolation trench with an insulating material, wherein formation of the isolation trench reduces the contact area between the gate electrode structure and the source/drain regions, and reduces the size of a depletion region associated with the channel without reducing the width of the channel.

BRIEF DESCRIPTION OF THE DRAWINGS

FIGS. 12 to 14 are cross-sectional views again along lines I-I' and II-II' of FIG. 2 illustrating the fabrication of a transistor in accordance with another embodiment of the invention incorporating a lateral reduced source/drain structure.

DESCRIPTION OF EMBODIMENTS

Figure 1:
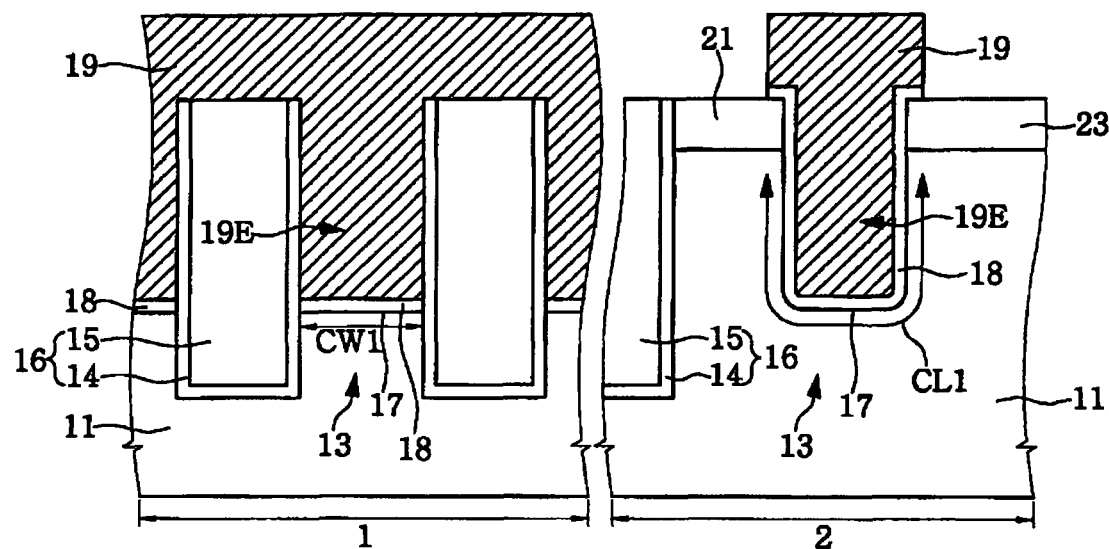
FIG. 1 is a cross-sectional view of a conventional RCAT.

Embodiments of the invention will now be described with reference to the accompanying drawings. However, the invention may be variously embodied and should not be construed as being limited to only the illustrated embodiments. Rather, the illustrated embodiments are presented as teaching examples.

In the drawings, the thickness of various layers and region (or the relative thickness of layers and regions) may be exaggerated for clarity. Throughout the drawings and written description, like reference numbers refer to like or similar elements. As used herein the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the drawings. For example, if the device in a particular drawing is turned over, elements described as being on the "lower" side of other elements would then be oriented on "upper" sides of the other elements. Similarly, if the device in one of the figures is turned over, elements described as "below" or "beneath" other elements would then be oriented "above" the other elements. In sum, such terms of relative orientation are just that, relative.

Embodiments of the present invention are described herein with reference to cross-section illustrations that are schematic in nature and related to idealized embodiments. As such, variations from the shapes of the illustrations as a result, for example, of manufacturing techniques and/or tolerances, are to be expected. Thus, embodiments of the present invention should not be construed as strictly limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention, absent clear written description to the contrary.

Figure 2:
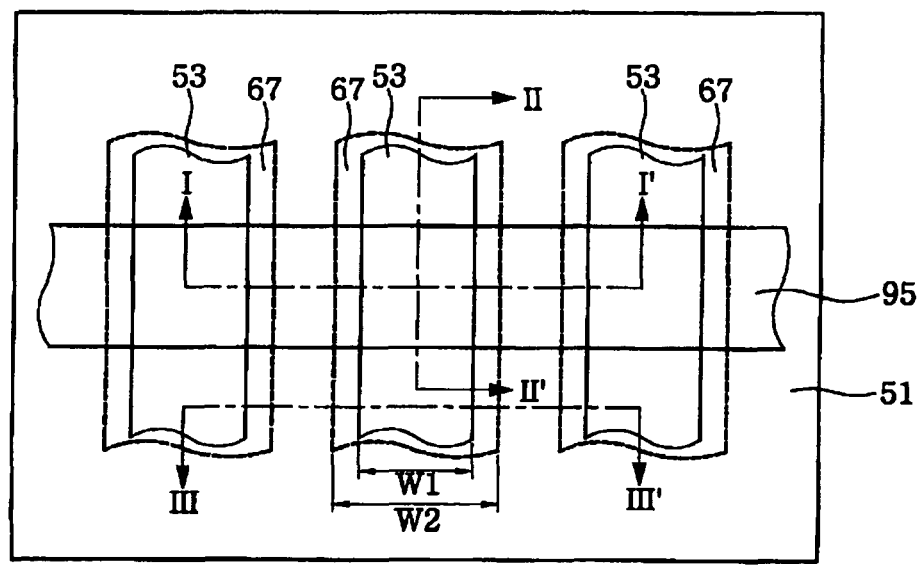
FIG. 2 is a layout of a transistor in accordance with an embodiment of the invention.

FIG. 2 illustrates a layout of a transistor in accordance with an embodiment of the invention. FIGS. 3 to 10 are cross-sectional views illustrating the fabrication of the transistor shown in FIG. 2. First regions X1 of FIGS. 3 to 9 are cross-sectional views taken along line I-I' of FIG. 2, and second regions Y1 are cross-sectional views taken along line II-II' of FIG. 2. The line I-I' of FIG. 2 is a word line direction associated with the transistor, and line II-II' is a bit line direction. FIG. 10 is a cross-sectional view taken along line III-III' of FIG. 2.

A transistor according to an embodiment of the invention will now be described with reference to FIGS. 2, 9, and 10. The transistor includes a substrate 51 having an upper active region 53 of first width W1 formed therein. Substrate 51 may be a semiconductor substrate, such as a silicon wafer. A lower active region 67 is disposed under upper active region 53. Lower active region 67 has a second width W2 greater than the first width W1. An isolation region 77 is formed in substrate 51 to define, at least in part, upper and lower active regions 53 and 67. A gate trench 83 is formed across upper and lower active regions 53 and 67. Gate trench 83 penetrates through upper active region 53 to extend into lower active region 67. A gate electrode 93 is formed in gate trench 83 and crosses upper and lower active regions 53 and 67.

In the illustrated embodiment, isolation region 77 includes an upper isolation region 75 and a lower isolation region 74. Lower isolation region 74 extends from a bottom portion of upper isolation region 75. In the illustrated embodiment, lower isolation region 74 is narrower in width than upper isolation region 75. Indeed, lower isolation region 74 may be narrower in its width than the resolution limit of the photolithography process used to form isolation region 77. This particular option will be described in some additional detail hereafter.

Upper isolation region 75 defines, at least in part, upper active region 53. Lower isolation region 74 defines, at least in part, lower active region 67. In this context, it is understood that upper active region 53 and lower active region 67 may form a unitary material structure, (i.e., a region of continuous material). Alternately, upper active region 53 and lower active region 67 may form non-unitary material structures.

In the illustrated embodiment, upper isolation region 75 includes an insulating layer 73 and a spacer 65 covering sidewalls of insulating layer 73. Spacer 65 may be, for example, a silicon oxide layer, a silicon nitride layer, a silicon oxynitride layer, or a combination layer thereof. For example, spacer 65 may be composed of sequentially stacked upper sidewall oxide layer 61, nitride liner 62, and spacer oxide layer 63. In one embodiment, upper sidewall oxide layer 61 may be a thermal oxide layer, nitride liner 62 may be a silicon nitride layer or a silicon oxynitride layer, and spacer oxide layer 63 may be a silicon oxide layer. Here, upper sidewall oxide layer 61 contacts upper active region 53, spacer oxide layer 63 contacts insulating layer 73, and nitride liner 62 is interposed between upper sidewall oxide layer 61 and spacer oxide layer 63.

In the illustrated embodiment, lower isolation region 74 includes insulating layer 73 and a lower sidewall oxide layer 71 covering insulating layer 73. That is, insulating layer 73 may extend to lower isolation region 74 from upper isolation region 75. Insulating layer 73 may be formed from, for example, a high-density plasma (HDP) oxide layer, a spin on glass (SOG) layer, or a combination thereof. Lower sidewall oxide layer 71 may be a thermal oxide layer.

Upper active region 53 is defined to have first width W1 by upper isolation region 75. Lower active region 67 is defined to have second width W2 by lower isolation region 74. The size of first width W1 may be determined by the resolution limit of the photolithography process being used in fabrication. However, lower isolation region 74 may be narrower than upper isolation region 75. In this case, second width W2 will be greater than first width W1. That is, lower active region 67 will have a greater width than upper active region 53.

Gate trench 83 may include an upper gate trench 81 and a lower gate trench 82. Lower gate trench 82 may be wider than upper gate trench 81.

Upper gate trench 81 is formed through upper active region 53. In addition, upper gate trench 81 may be disposed across upper active region 53 in the direction of first width W1. In this case, upper gate trench 81 may have a width equal to or greater than first width W1.

Lower gate trench 82 extends from the bottom of upper gate trench 81. Lower gate trench 82 may be disposed across the lower active region 67 in the direction of second width W2. In this case, lower gate trench 82 may have a width equal to or greater than second width W2. At least the bottom surface of lower gate trench 82 is disposed within lower active region 67 and will expose portions of lower active region 67. In addition, lower gate trench 82 may partially expose the sidewall of lower isolation region 74.

Taken in combination, the linear-sided upper gate trench 81 and the curved (i.e., partially spherical) lower gate trench 82 of the illustrated embodiment form gate trench 83 having a flask-shaped cross-section.

A metal silicide pattern 94 may be formed from an upper surface portion of gate electrode 93. Gate electrode 93 and metal silicide pattern 94 form a gate pattern 95. Gate electrode 93 may include an upper gate electrode 93E filling upper gate trench 81, and a lower gate electrode 93S filling lower gate trench 82. In one embodiment, upper gate electrode 93E and lower gate electrode 93S will form a unitary material structure, (i.e., a continuous material region), while in other embodiments, upper gate electrode 93E and lower gate electrode 93S may be formed as non-unitary material structures, albeit in an electrically conductive manner.

Upper gate electrode portion 93E may have a width equal to or greater than the first width W1, and a lower gate electrode portion 93S may have a width equal to or greater than the second width W2. Lower gate electrode portion 93S may be partially in contact with the sidewall of lower isolation region 74. Consistent with the shape of gate trench 83, the combination of upper gate electrode portion 93E and lower gate electrode 93S will have a flask shape cross-section.

Gate electrode 93, upper gate electrode 93E, and lower gate electrode 93S may be formed from one or more conductive materials, such as polysilicon. Metal silicide pattern 94 may be formed from a metal silicide layer, such as a tungsten silicide layer. In addition, a capping pattern 97 may be formed on gate pattern 95. Capping pattern 97 may be formed, for example, from a silicon nitride layer.

A gate dielectric layer 91 is interposed between gate electrode 93 and substrate 51. Gate dielectric layer 91 may be conformally formed on the exposed sidewall and bottom portions of gate trench 83. Gate dielectric layer 91 may include, for example, a silicon oxide layer or a high-k dielectric layer.

Source/drain regions 99 may be formed in substrate 51 at respective sides of gate electrode 93. Source/drain regions 99 may be, for example, high concentration impurity regions. In one embodiment, source/drain regions 99 are formed to a depth within substrate 51 greater than the depth of upper isolation region 75, although this is not required. However, source/drain regions 99 will not typically be formed to a depth greater than the depth of lower isolation region 74.

A conventional planar transistor may have an effective channel width equal to the first width W1. In contrast, according to the illustrated embodiment of the invention, the combination of gate electrode 93, source/drain regions 99, gate dielectric layer 91, and upper and lower active regions 53 and 67 form a spherical recess channel array transistor (SRCAT) having an effective channel width substantially equal to the second width W2. That is, an SRCAT designed and fabricated in accordance with an embodiment of the invention will secure a relatively large effective channel width. In effect, lower active region 67 acts to laterally extended the active region controlling the channel width.

The performance characteristics of an SRCAT designed and fabricated in accordance with the foregoing may be controlled by adjusting the depths and impurity concentrations of source/drain regions 99. If source/drain regions 99 are relatively shallow, the SRCAT may have a relatively longer effective channel length (e.g., CL2 in the illustrated example). However, if source/drain regions 99 are relatively deep, the SRCAT may have a relatively larger effective channel width.

Figure 3:
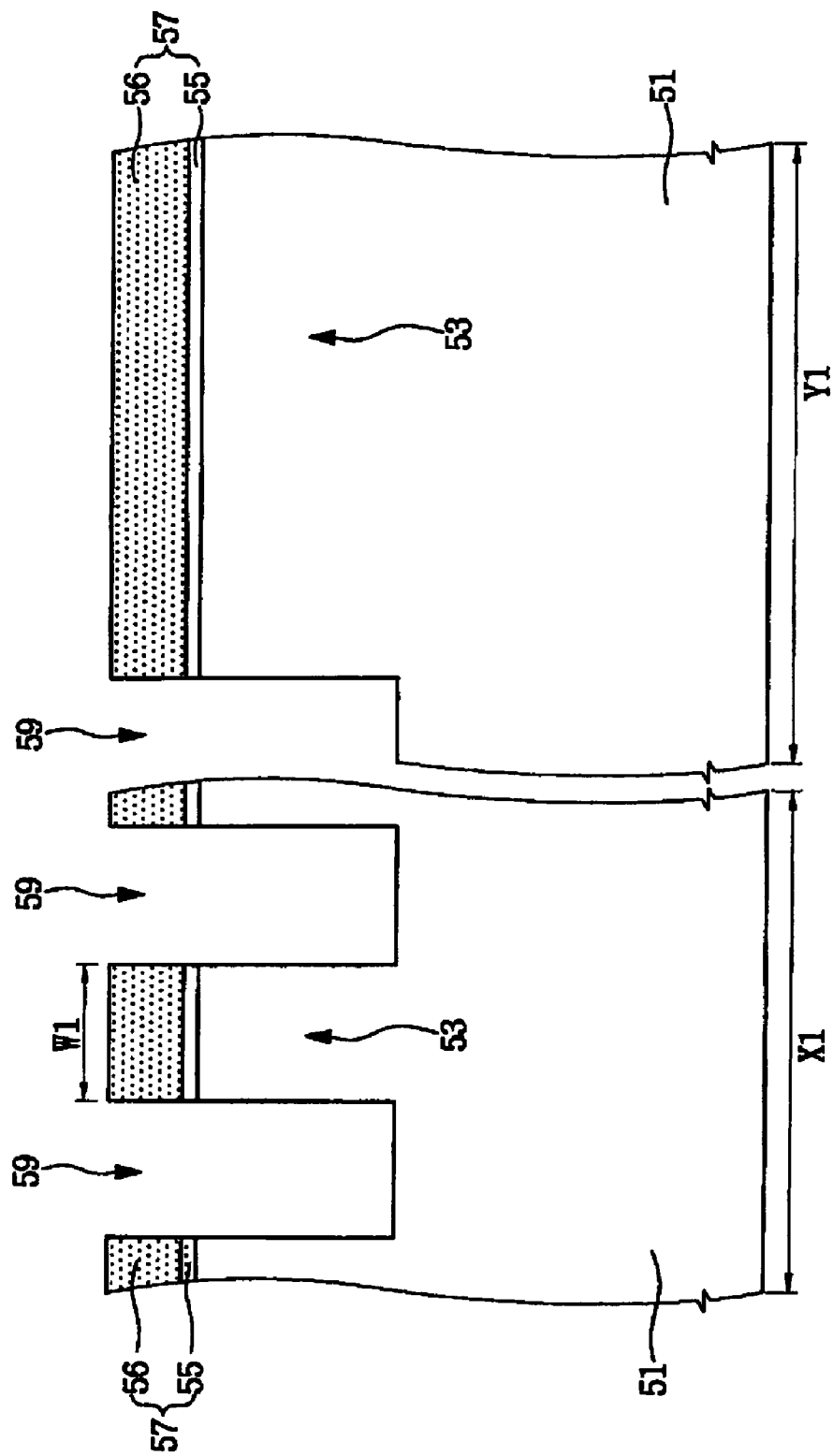
FIGS. 3 to 9 are cross-sectional views taken along lines I-I' and II-II' of FIG. 2 illustrating the fabrication of a transistor in accordance with an embodiment of the invention.

An exemplary method of fabricating the transistor illustrated in FIGS. 2, 9 and 10 according to an embodiment of the invention will now be described with reference to FIGS. 2 to 10. Referring to FIGS. 2 and 3, a pad oxide layer and a pad nitride layer are sequentially formed on substrate 51. Substrate 51 may be a semiconductor substrate, such as a silicon wafer. The pad oxide layer may include a thermal oxide layer. The pad nitride layer may include a silicon nitride layer or a silicon oxynitride layer. The pad oxide layer serves to relieve stress caused by a difference in the thermal expansion coefficients between substrate 51 and the pad nitride layer. The pad nitride layer and the pad oxide layer are then patterned to selectively expose portions of substrate 51 and to form a pad oxide pattern 55 and a pad nitride pattern 56. Collectively, pad oxide pattern 55 and pad nitride pattern 56 form a hard mask pattern 57.

The exposed portions of substrate 51 may now be anisotropically etched using hard mask pattern 57 as an etch mask to form an upper isolation trench 59. Upper active region 53 is defined within substrate 51 by upper isolation trench 59 with first width W1.

The geometry of hard mask pattern 57 may be determined by the resolution limit of the constituent photolithography process. In turn, upper active region 53 will be formed according to the geometry of hard mask pattern 57. Thus, first width W1 may be approximately the same as the resolution limit of the photolithography process.

Figure 4:
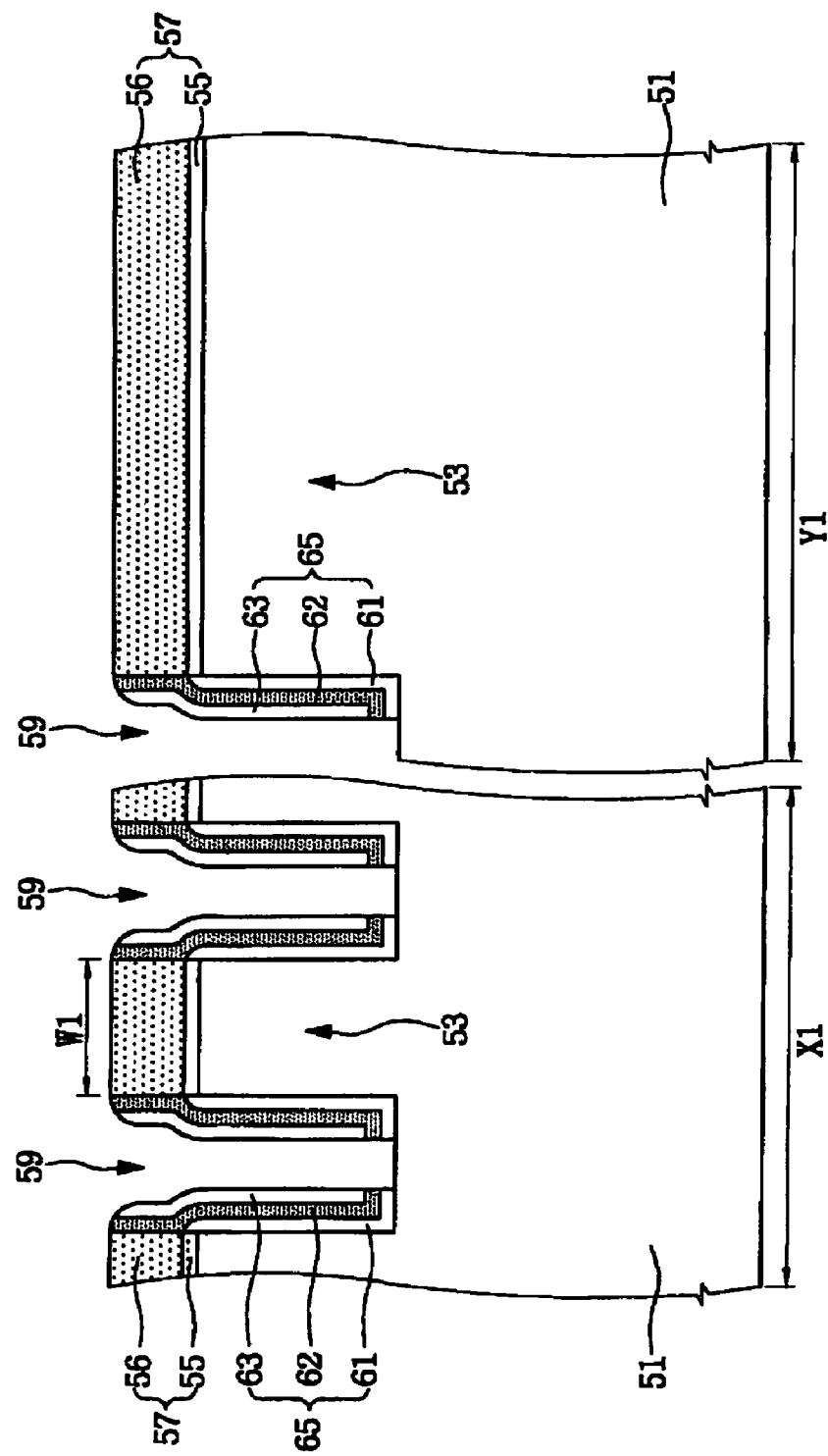

Referring to FIGS. 2 and 4, spacer 65 is formed on sidewalls of upper isolation trench 59. Spacer 65 may include, for example, a silicon oxide layer, a silicon nitride layer, a silicon oxynitride layer, or a combination thereof. In the illustrated example, spacer 65 includes an upper sidewall oxide layer 61, a nitride liner 62, and a spacer oxide layer 63. Upper sidewall oxide layer 61 is formed on the exposed sidewall and bottom portions (collectively "inner walls") of upper isolation trench 59. Nitride liner 62 is conformally formed on upper sidewall oxide layer 61. Spacer oxide layer 63 is then conformally formed on nitride liner 62.

In one embodiment, upper sidewall oxide layer 61 may be a thermal oxide layer, nitride liner 62 may be a silicon nitride layer or a silicon oxynitride layer, and spacer oxide layer 63 may be a silicon oxide layer formed by chemical vapor deposition (CVD).

Spacer oxide layer 63, nitride liner 62, and upper sidewall oxide layer 61 may be anisotropically etched to expose a bottom surface portion of upper isolation trench 59 while leaving spacer oxide layer 63, nitride liner 62, and upper sidewall oxide layer 61 on at least the sidewalls of upper isolation trench 59.

Figure 5:
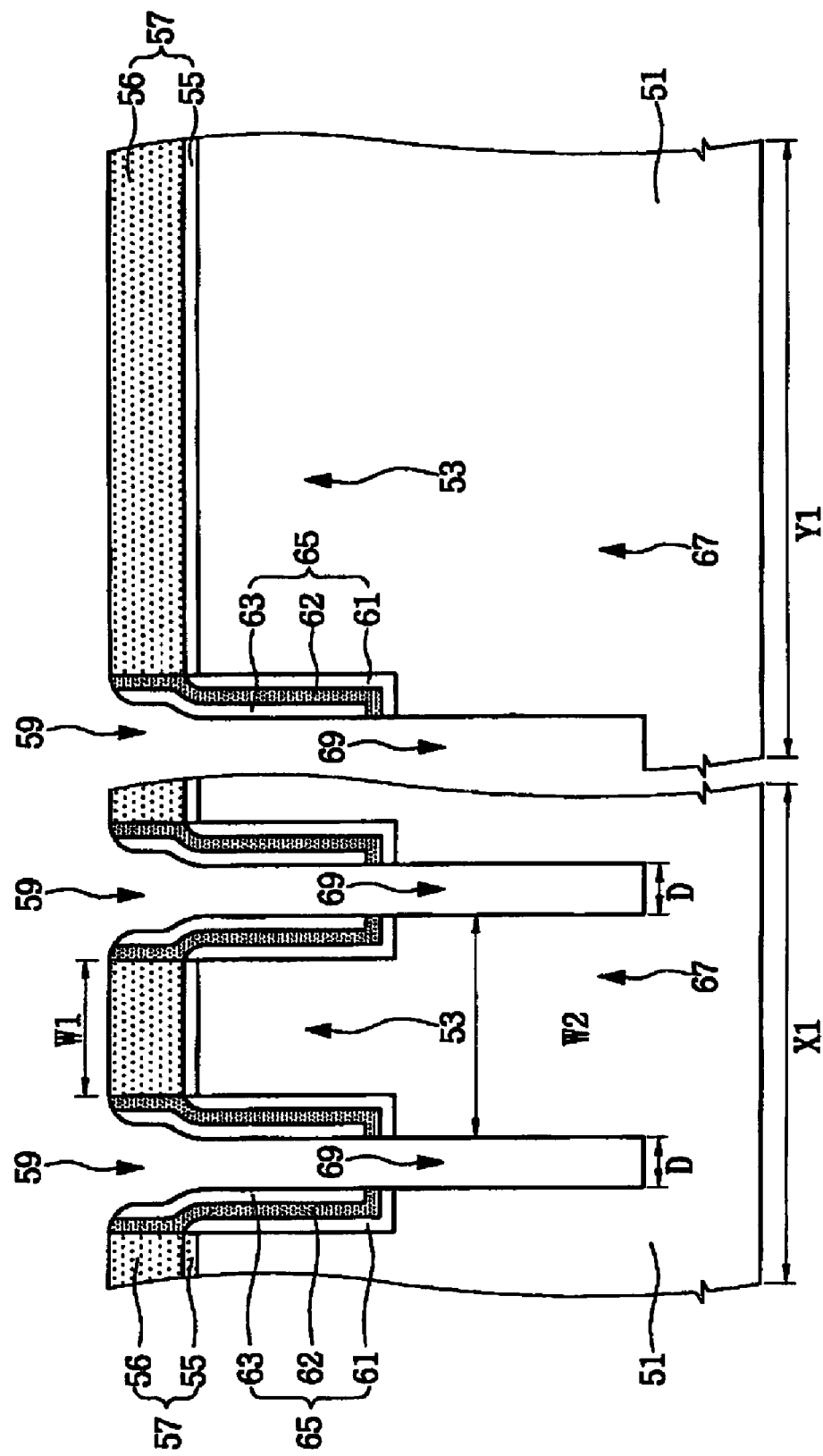

Referring to FIGS. 2 and 5, the portion of substrate 51 exposed by the opening formed in spacer 65 is anisotropically etched using spacer 65 and hard mask pattern 57 as etch masks to form lower isolation trench 69. Lower isolation trench 69 defines lower active region 67 below upper active region 53 having second width W2.

The portion of substrate 51 exposed through spacer 65 by the opening is narrower in width than upper isolation trench 59 due to the thickness of spacer 65 remaining on sidewall portions of upper isolation trench 59. Accordingly, a width "D" of lower isolation trench 69 may be less than the width of upper isolation trench 59. In addition, width D of lower isolation trench 69 may be less than a resolution limit of a photolithography process. The size of lower active region 67 is defined by lower isolation trench 69. Thus, second width W2 may be greater than first width W1. In other words, lower active region 67 may have a greater width than upper active region 53.

Figure 6:
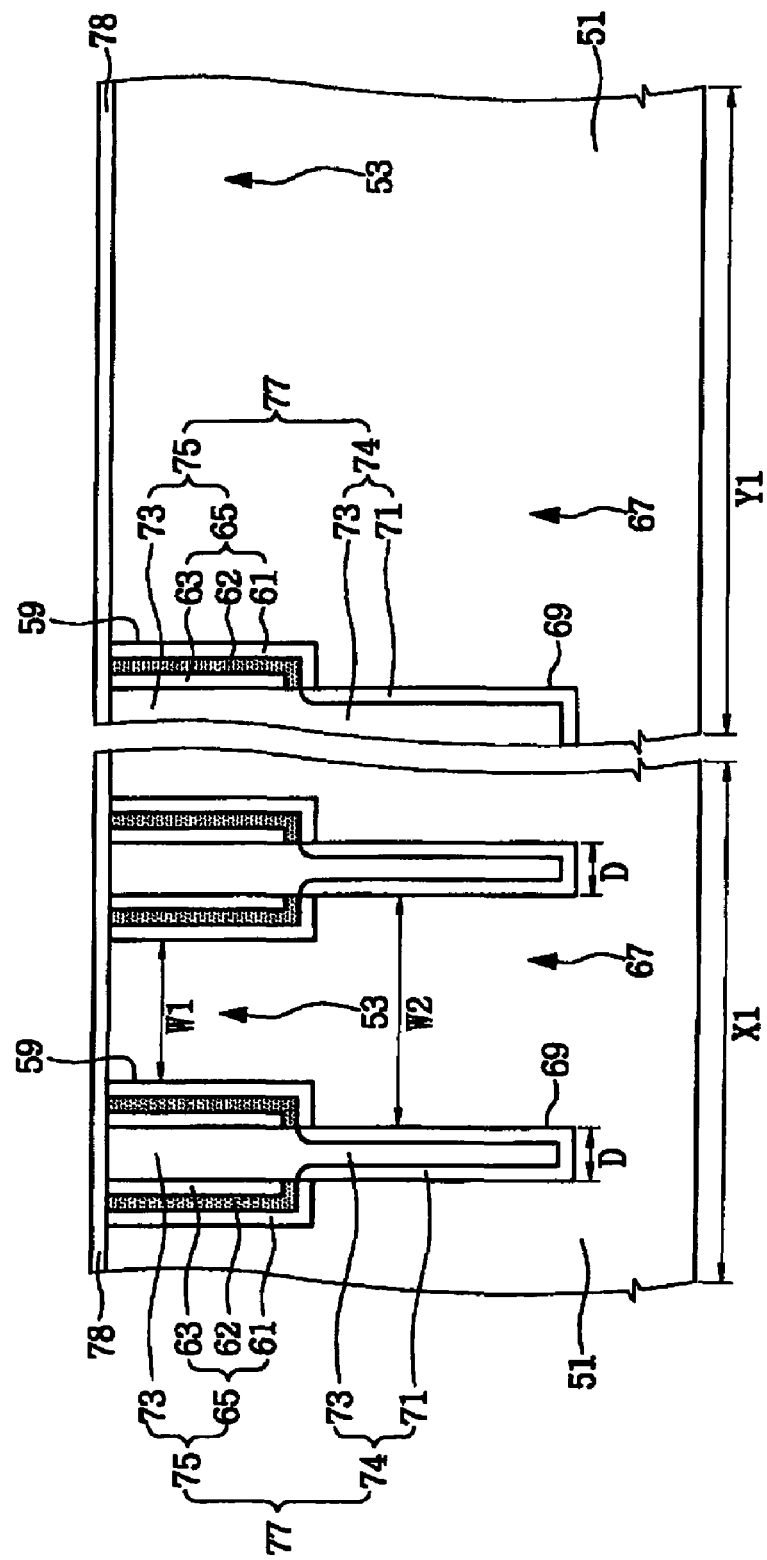

Referring to FIGS. 2 and 6, a lower sidewall oxide layer 71 is formed on inner walls of lower isolation trench 69. Lower sidewall oxide layer 71 may be formed from a thermal oxide layer. Subsequently, an insulating layer 73 may be formed to fill lower isolation trench 69 and upper isolation trench 59 and to cover any exposed portions of substrate 51. Insulating layer 73 may be formed from a HDP oxide layer, a SOG layer, or a combination thereof. Insulating layer 73 is then planarized to expose hard mask pattern 57. Following planarization, hard mask pattern 57 is removed to expose upper active region 53. In one embodiment, hard mask pattern 57 may be removed using a wet cleaning process. During the removal of hard mask pattern 57, insulating layer 73 and/or spacer 65 may be partially etched.

In this manner, upper isolation region 75 is formed within upper isolation trench 59, a lower isolation region 74 is formed within lower isolation trench 69. Lower isolation region 74 and upper isolation region 75 combine in the illustrated example to form isolation region 77. Lower isolation region 74 includes insulating layer 73 and lower sidewall oxide layer 71 covering insulating layer 72. Upper isolation region 75 includes insulating layer 73 and spacer 65 covering insulating layer 73.

A sacrificial oxide layer 78 may now be formed on the upper surface of active region 53. Sacrificial oxide layer 78 may be formed from a silicon oxide layer. Channel ions may be implanted into substrate 51 through sacrificial oxide layer 78. When implanted, channel ions penetrate sacrificial oxide layer 78 and down to a desired depth within upper active region 53 and/or lower active region 67.

Figure 7:
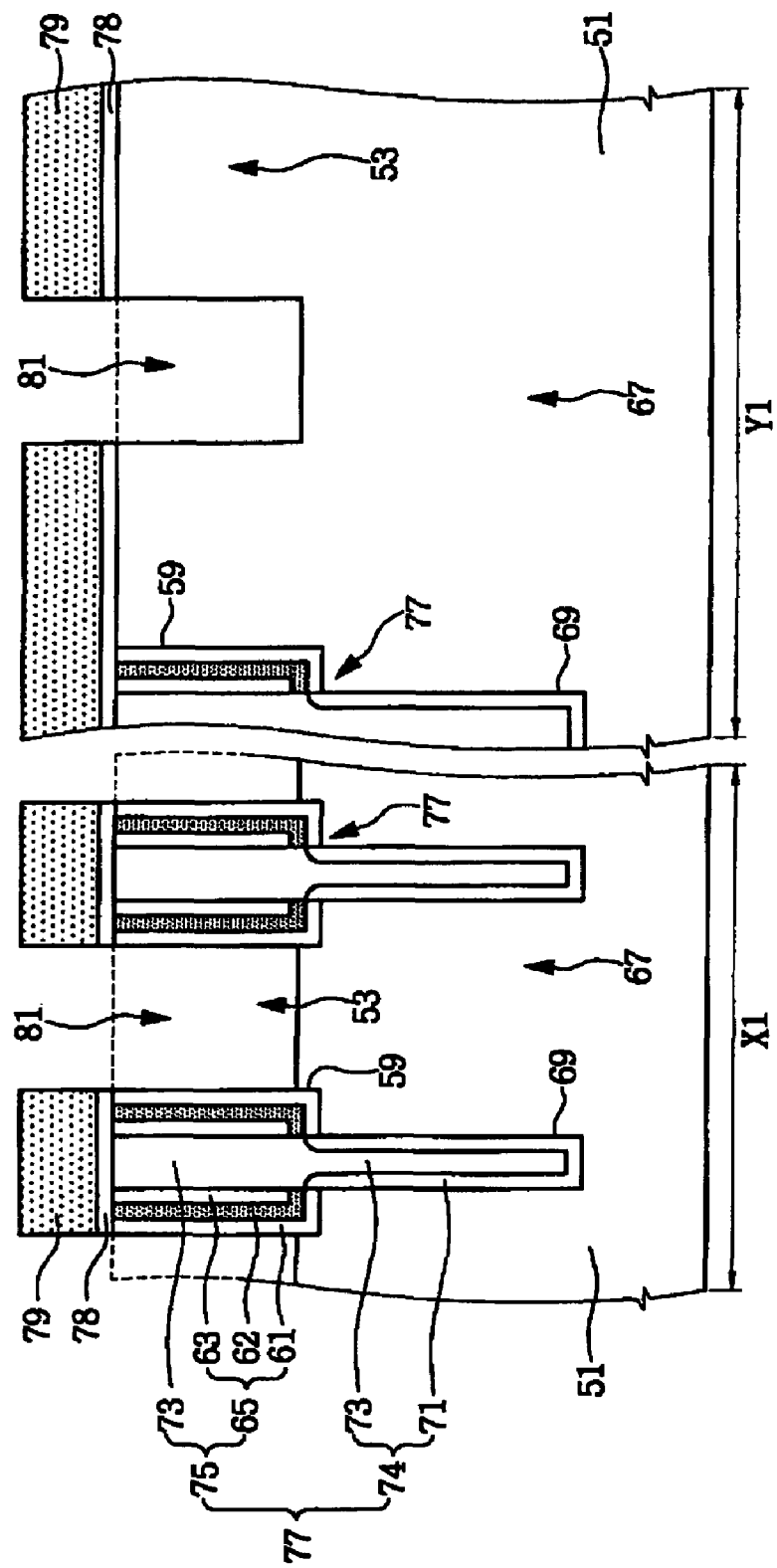

Referring to FIGS. 2 and 7, a gate mask pattern 79 may be formed on sacrificial oxide layer 78. Gate mask pattern 79 may be formed from a silicon nitride layer. Gate mask pattern 79 includes an opening crossing upper active region 53. Following formation of gate mask pattern 79, portions of sacrificial oxide layer 78 exposed through the opening may be removed, (i.e., an upper surface portion of upper active region 53 may be exposed by the opening).

The exposed portion of upper active region 53 may now be anisotropically etched using gate mask pattern 79 as an etch mask to form an upper gate trench 81. The anisotropic etching process used to form this element may have an etch selectivity between upper isolation region 75 and upper active region 53. A bottom surface of upper gate trench 81 may be higher than an upper surface of lower isolation region 74, (i.e., upper gate trench 81 crossing the upper active region 53 may be formed within upper active region 53). In the illustrated embodiment of FIG. 7, the sidewalls of upper isolation region 75 may be partially exposed by upper gate trench 81, (i.e., upper gate trench 81 may have substantially the same width as first width W1). Further, the sidewalls of upper gate trench 81 are anisotropically formed to be substantially linear in shape. Ideal anisotropic etching would result in straight, vertical and parallel sidewalls for upper gate trench 81. However, those of ordinary skill in the art recognize that some tilt or less than vertical orientation for the sidewall may results from process imperfections. Recognizing these inevitable process variations and yet respecting design tolerances, the sidewalls defining upper gate trench 81 of the embodiment illustrated in FIG. 7 is said to be "linear" in nature. That is, the anisotropic etching is intended to form linear (i.e., substantially noncurved) sidewalls.

Figure 8:
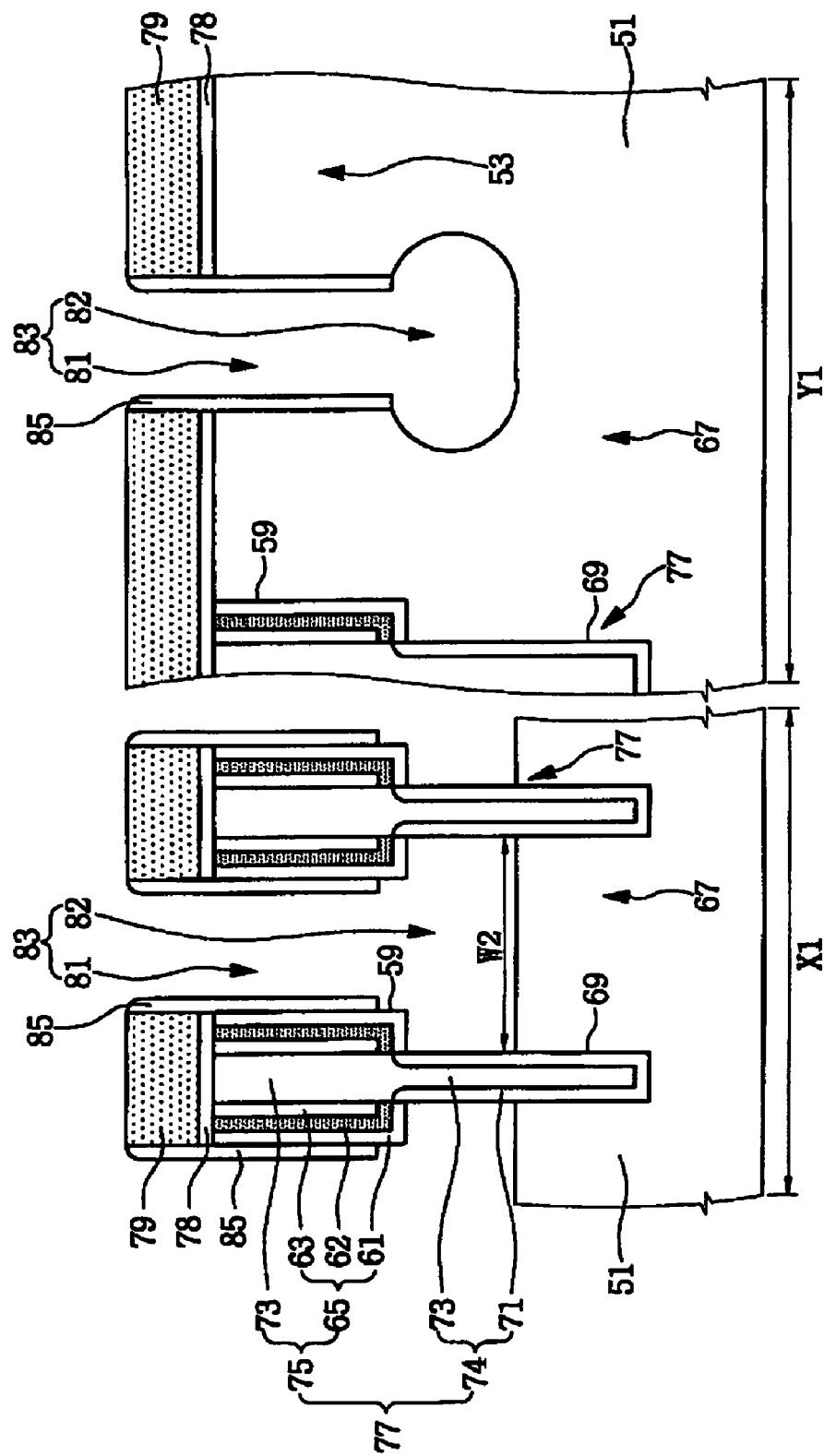

Referring to FIGS. 2 and 8, a sacrificial spacer 85 is now formed on the sidewalls of upper gate trench 81. Specifically, a conformal sacrificial layer may be formed on substrate 51 once upper gate trench 81 is formed. The sacrificial layer may be formed from a CVD silicon oxide layer. The sacrificial layer may then be anisotropically etched to remove a bottom portion, thereby forming sacrificial spacer 85. The anisotropic etching will be carried out until substrate 51 is exposed at the bottom surface of upper gate trench 81.

The portion of substrate 51 exposed at the bottom of upper gate trench 81 is then isotropically etched in using sacrificial spacer 85 and gate mask pattern 79 as etch masks in order to form lower gate trench 82. In the illustrated embodiment of FIG. 8, the isotropic etching process is continued until a bottom surface of lower gate trench 82 is formed at a lower depth than the depth of upper active region 53. In addition, the isotropic etching process is terminated when the bottom surface of lower gate trench 82 is formed to a depth higher than the depth of lower isolation region 74. Thus, lower active region 67 is exposed by at least bottom surface of lower gate trench 82. In the context of the illustrated embodiment, lower gate trench 82 is formed with a curved (i.e., a partially spherical) shaped, as compared with the linear shape of upper gate trench 81. Note that the term "spherical" in this context is not intended to indicate a true (or perfect) sphere. Rather, the continuously curved nature of the sidewalls forming lower gate trench 82 suggest a sphere-like cross-section. Clearly, the top and bottom surfaces of lower gate trench 82 may be more flattened (or linear) in their nature, but the overall effect of the isotropic etching process is intended to form lower gate trench 82 having sidewalls more curved (or bowed) in their nature than linear (or straight). This, in this descriptive context the terms "linear" and "curved" are relative in their comparative nature.

Thus, as the isotropic etching process is performed, portions of substrate 51 exposed through the bottom surface of upper gate trench 81 will be substantially uniformly etched in all directions. As a result, lower gate trench 82 will have a width greater than the width of upper gate trench 81. Lower gate trench 82, as formed below upper gate trench 81, may cross lower active region 67. Sidewalls of lower isolation region 74 may be partially exposed by lower gate trench 82, (i.e., lower gate trench 82 may have substantially the same width as the second width W2). Upper gate trench 81 and lower gate trench 82 collectively form gate trench 83. In the illustrated example, gate trench 83 has a flask shaped cross-sectional.

Following formation of lower gate trench 82, sacrificial spacer 85 and gate mask pattern 79 may be removed to again expose the inner walls of gate trench 83 and the top surface of upper active region 53.

Figure 9:
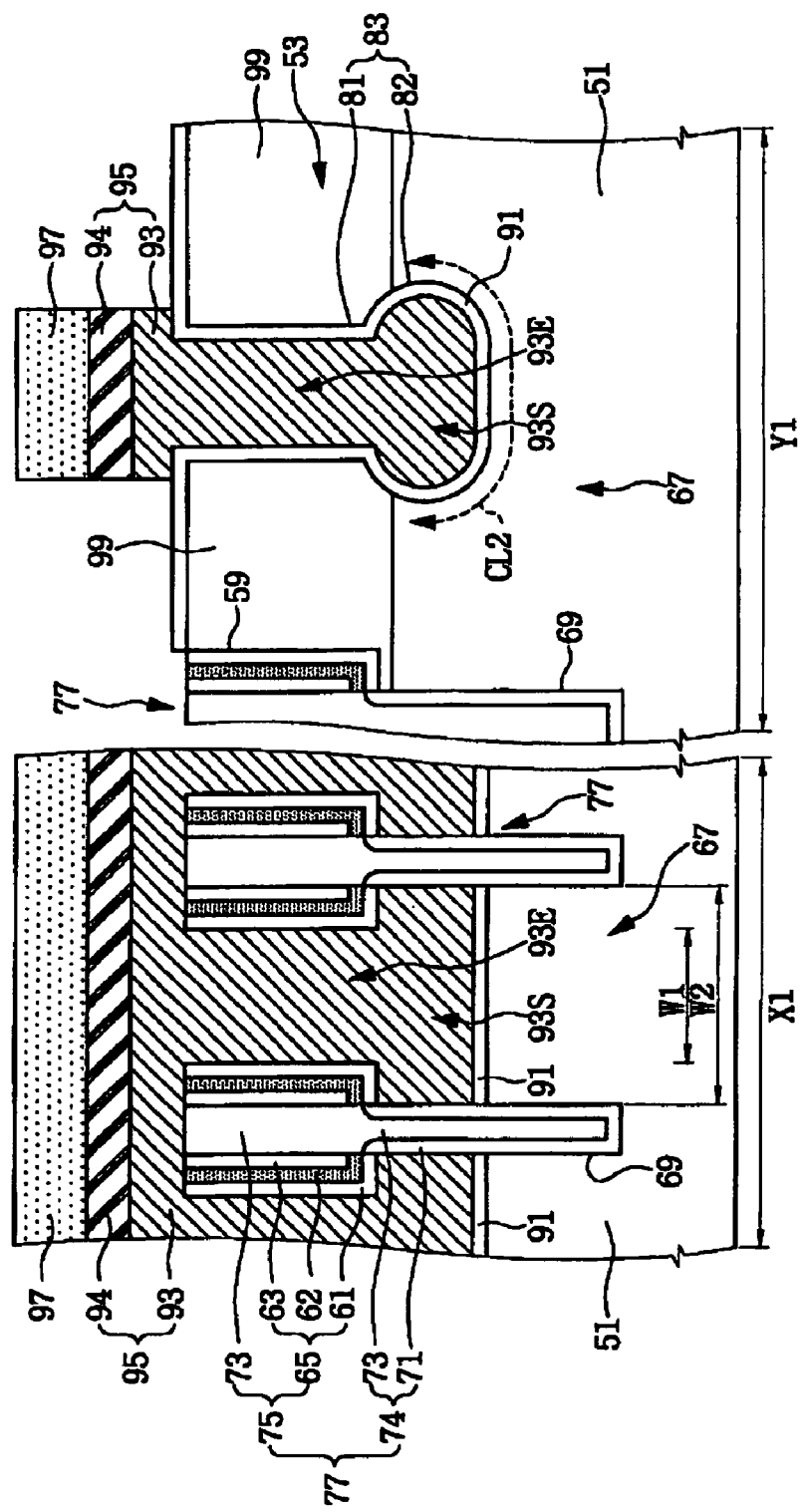
Figure 10:
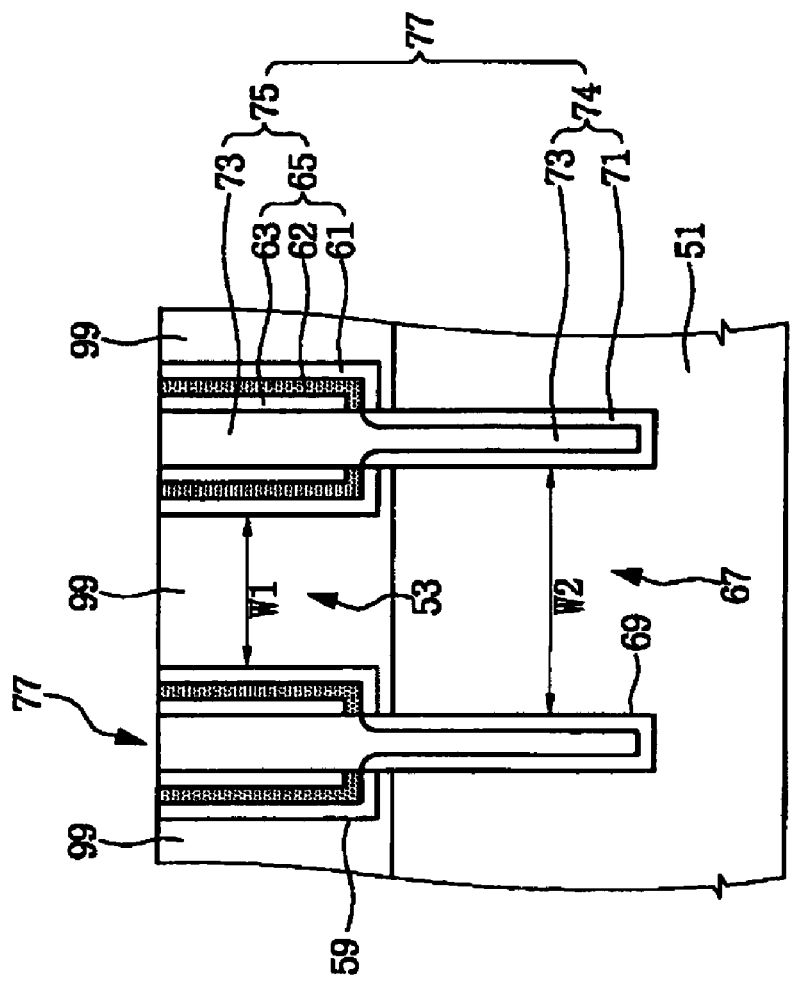
FIG. 10 is a cross-sectional view taken along line III-III' of FIG. 2 illustrating the fabrication of a transistor in accordance with an embodiment of the invention.

Referring to FIGS. 2, 9, and 10, gate dielectric layer 91 is formed on the inner walls of gate trench 83 and top surface of upper active region 53. Gate dielectric layer 91 may be formed from a silicon oxide layer, a high-k dielectric layer, or a combination thereof. Gate dielectric layer 91 will substantially and uniformly cover the inner walls of gate trench 83 and the top surface of upper active region 53. In one embodiment, gate dielectric layer 91 is formed from a silicon oxide layer formed by a thermal oxidation process.

A gate conductive layer is formed to fill gate trench 83 and cover substrate 51. The gate conductive layer may be formed from a polysilicon layer. A metal silicide layer may then be formed on the gate conductive layer. The metal silicide layer may be formed from a tungsten silicide layer, a cobalt silicide layer, or a nickel silicide layer. A capping layer may then be formed on the metal silicide layer. The capping layer may be formed from a silicon nitride layer.

The capping layer, metal silicide layer, the gate conductive layer are then patterned to form respectively a capping pattern 97, a metal silicide pattern 94, and a gate electrode 93. Gate electrode 93 and metal silicide pattern 94 collectively form a gate pattern 95. Gate electrode 93 extends across upper active region 53 and lower active region 67. In addition, gate dielectric layer 91 may remain on upper active region 53 on both sides of gate electrode 93. Alternatively, the top surface of upper active region 53 on both sides of gate electrode 93 may be exposed.

Gate electrode 93 comprises an upper gate electrode 93E filling upper gate trench 91 and a lower gate electrode 93S filling lower gate trench 82. Upper gate electrode 93E may have substantially the same width as the first width W1, and lower gate electrode 93S may have substantially the same width as the second width W2. Lower gate electrode 93S may partially contact the sidewall of lower isolation region 74.

Impurity ions may be implanted into substrate 51 on respective sides of gate electrode 93 to form source/drain regions 99. Source/drain regions 99 may be formed, for example, by high concentration impurity regions. The implantation of impurity ions may be carried out at various angles and energies. Source/drain regions 99 may formed to a depth lower than the depth of upper isolation region 75, as illustrated in FIG. 9, but less deep than the depth of lower isolation region 74.

According to the foregoing embodiments of the invention, gate electrode 93, source/drain regions 99, gate dielectric layer 91, and upper and lower active regions 53 and 67 essentially form a SRCAT. Lower active region 67 may have second width W2 greater than the first width of upper active region 53. Gate electrode 93 comprises lower gate electrode 93S having substantially the second width W2. Accordingly, a SRCAT designed and fabricated in accordance with an embodiment of the invention may secure an effective channel width substantially equal to the second width W2. Additionally, a SRCAT designed and fabricated in accordance with an embodiment of the invention may secure a relatively large effective channel width with lower active region 67 serving as a laterally extended active region. Consequently, a semiconductor device having a laterally extended active region may be fabricated.

As noted above, the performance characteristics of the SRCAT may be controlled by adjusting the doping (e.g., implantation) depths of source/drain regions 99. When source/drain regions 99 are relatively shallow, the SRCAT will exhibit a relatively long effective channel length CL2. When source/drain regions 99 are relatively deep, the SRCAT will exhibit a relatively large effective channel width.

Despite the overall improvements in the ability of the foregoing embodiments to define source/drain regions as well as upper and lower active regions to obtain desired drive current characteristics, some issues remain. For example, leakage current and in particular gate induced leakage (GIDL) current must be addressed. Those of ordinary skill in the art recognize that leakage current dramatically effects the refresh rate for volatile memory devices and power consumption characteristics for a host device incorporating the memory.

GIDL is directly related to the cross-sectional contact area between source/drain regions and a gate electrode structure. By reducing the contact area between source/drain regions and the gate electrode structure, GIDL may be reduced. In another embodiment of the invention, the design and fabrication of the isolation trench defining active regions for a RCAT transistor may be altered to effectively reduced this contact area.

Figure 11A:
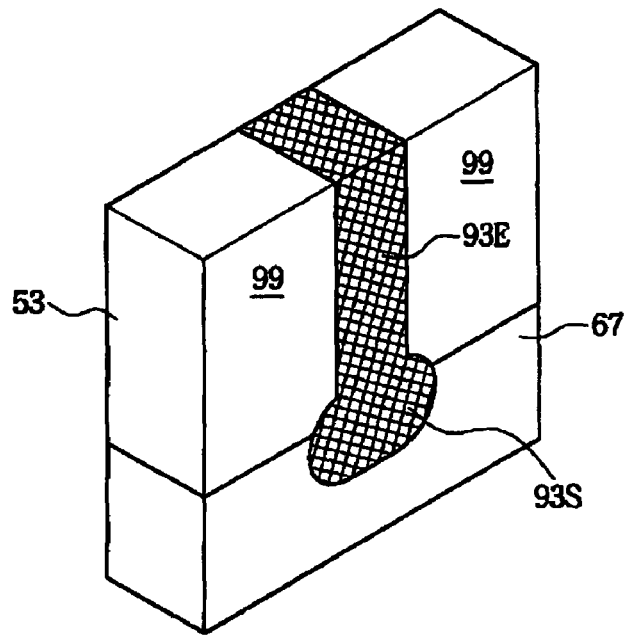
FIGS. 11A and 11B are cross-sectional views illustrating the further incorporation of a lateral reduced source/drain structure within another embodiment of the invention.
Figure 11B:
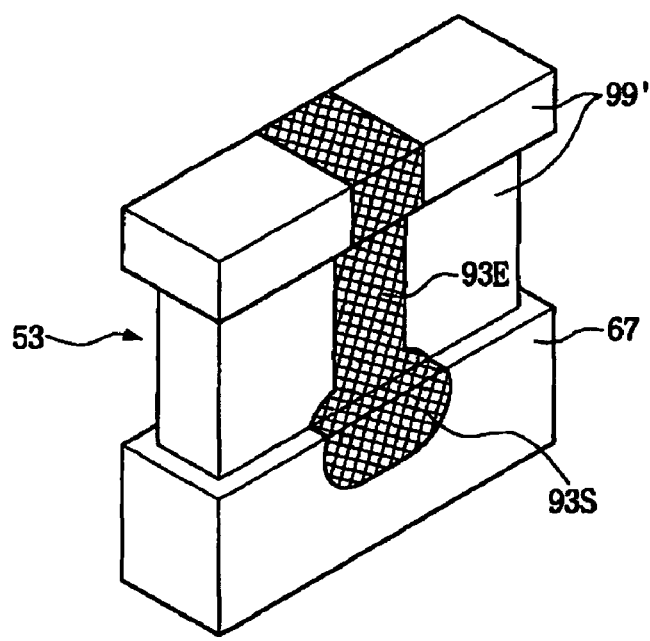

Consider, for example, the cross-section shown in FIG. 11A which is an expanded partial view of the cross-section shown in region Y1 of FIG. 9. Here, source/drain regions 99 formed in upper active region 53 have a conventional cross-section that fully contacts upper gate electrode 93E and, at least in the illustrated example, a portion of lower gate electrode 93S. By modifying the shape of isolation region 77 and particularly upper isolation region 75, some of the cross-sectional contact area of source/drain regions 99' by be removed, thereby reducing the potential for GIDL. FIG. 11B conceptually illustrates this result. A reduced overall cross-section for source drain regions 99'—which reduces the contact area between respective source/drain regions 99' and gate electrode 93—will be referred to hereafter as a "lateral reduced source/drain structure." As may be seen by a comparison of FIGS. 11A and 11B, the lateral reduced source/drain structure is characterized by a reduced source/drain cross-sectional width.

Figure 14:
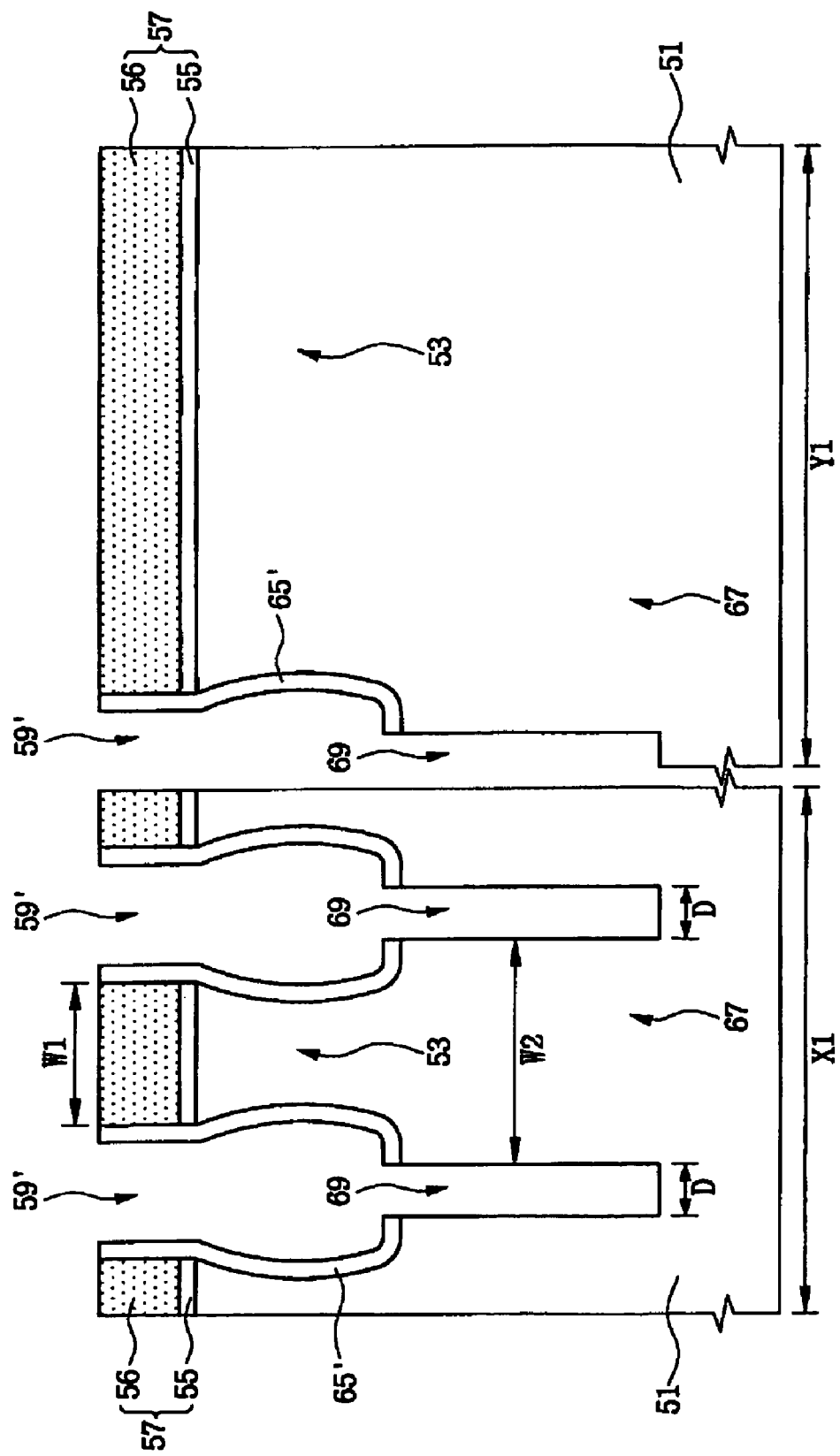

FIGS. 12, 13 and 14 further illustrate a method of fabricating a RCAT incorporating the lateral reduced source/drain structure. The method alternative described with reference to FIGS. 12, 13, and 14 may be compared with the former description related to FIGS. 3, 4, and 5.

With reference to FIG. 12, following formation and patterning of hard mask pattern 57, exposed portions of substrate 51 are etched to form upper isolation trench 59'. In the embodiment illustrated in FIG. 3, upper isolation trench 59 was defined within upper active region 53 with first width W1 using an anisotropic etching process. This process resulted in upper isolation trench 59 having substantially linear and vertical sidewalls. In contrast, the embodiment illustrated in FIG. 12, uses a wet etching process, and/or an dry etching process to form upper isolation trench 59' having curved (or bowed) sidewalls. Stated in other geometric terms, the sidewalls of upper isolation trench '59' have, at least in part, a negative profile (i.e., a profile having a negative slope). In one specific embodiment, an isotropic Reactive Ion Etching (RIE) process may be used to form upper isolation trench 59'.

As illustrated in FIG. 13, following the formation of upper isolation trench 59' having at least in part a negative profile, a spacer 65' is formed on exposed surfaces of upper isolation trench 59'. As an alternative to spacer 65 previously described, spacer 65' may be formed by a medium temperature oxide (MTO).

As illustrated in FIG. 14, a portion of spacer 65' may be removed using an anisotropic dry etch to exposed a portion of substrate 51 at the bottom of upper isolation trench 59'. As before, a lower isolation trench 69 may be formed in the exposed portion of substrate 51. A substantially anisotropic etching process may be used to form lower isolation trench 69. Following the formation of lower isolation trench 69, isolation region 77, being formed by the combination of upper isolation trench 59 and lower isolation trench 69, may be filled with an insulating material. In one embodiment, a flowable oxide such as SOG, Tosz, USG, etc., may be used fill isolation trench 77. The in-fill of isolation trench 77 may be accomplished by one or more depositions of the insulating material. In certain embodiments, voids may be advantageously formed in center portions of isolation trench 77 within the insulating material.

Once isolation trench 77 has been filled with insulating material, the resulting structure may be conventionally planarized using hard mask pattern 57 as a etch stop. From this point, the former method previously described in relation to FIGS. 6 through 9 may be used. The RCAT that results is similar to the foregoing example, save the structure of isolation trench 77 and in particular upper isolation trench 59' has been altered to reduce contact area between source/drain regions 99 and the gate electrode structure 93.

Figure 15:
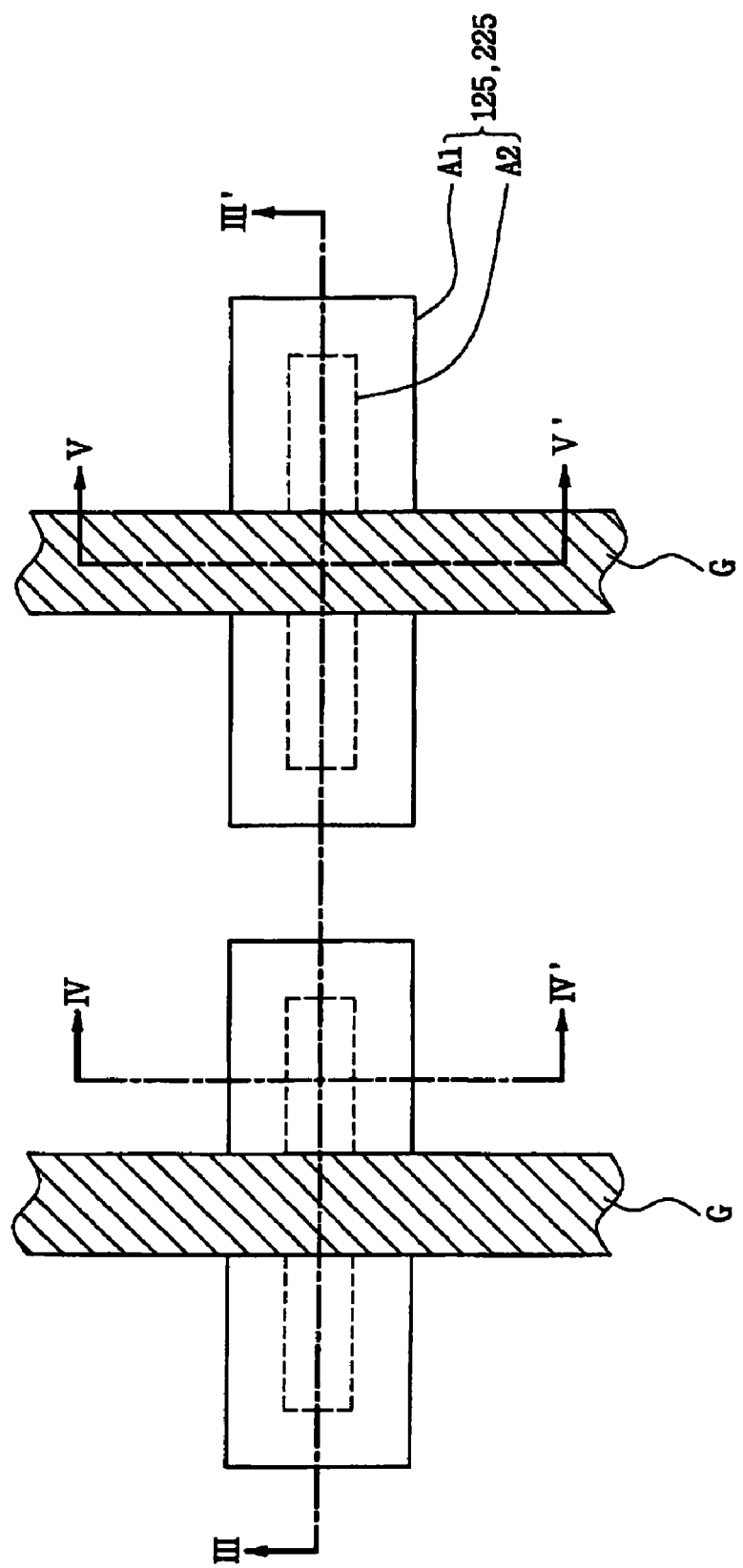
FIG. 15 is a plane view illustrating a semiconductor device in accordance with still another embodiment of the invention.
Figure 16A:
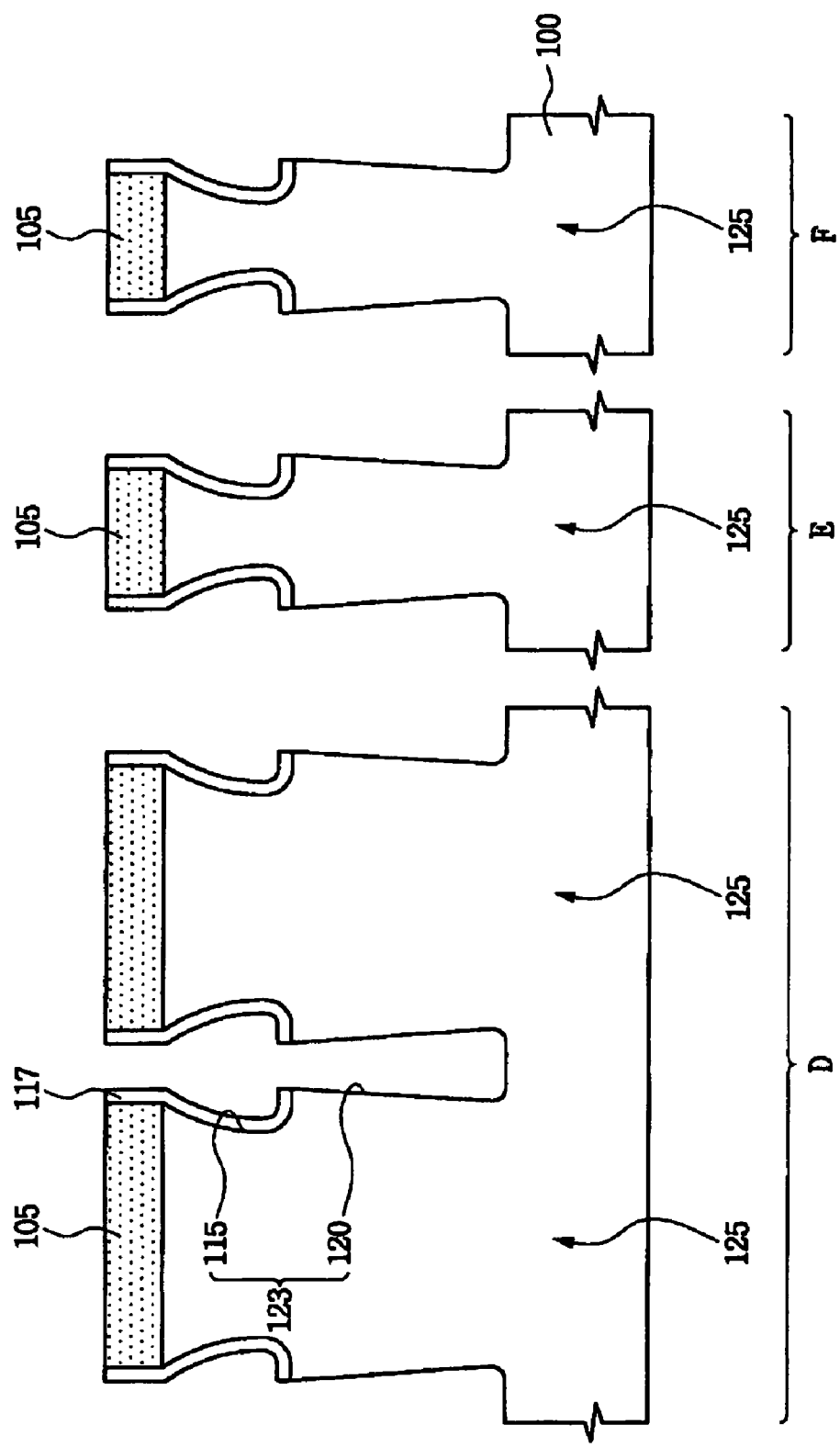
FIGS. 16A and 16B are cross-sectional views illustrating a semiconductor device in accordance with still another embodiment of the invention.
Figure 16B:
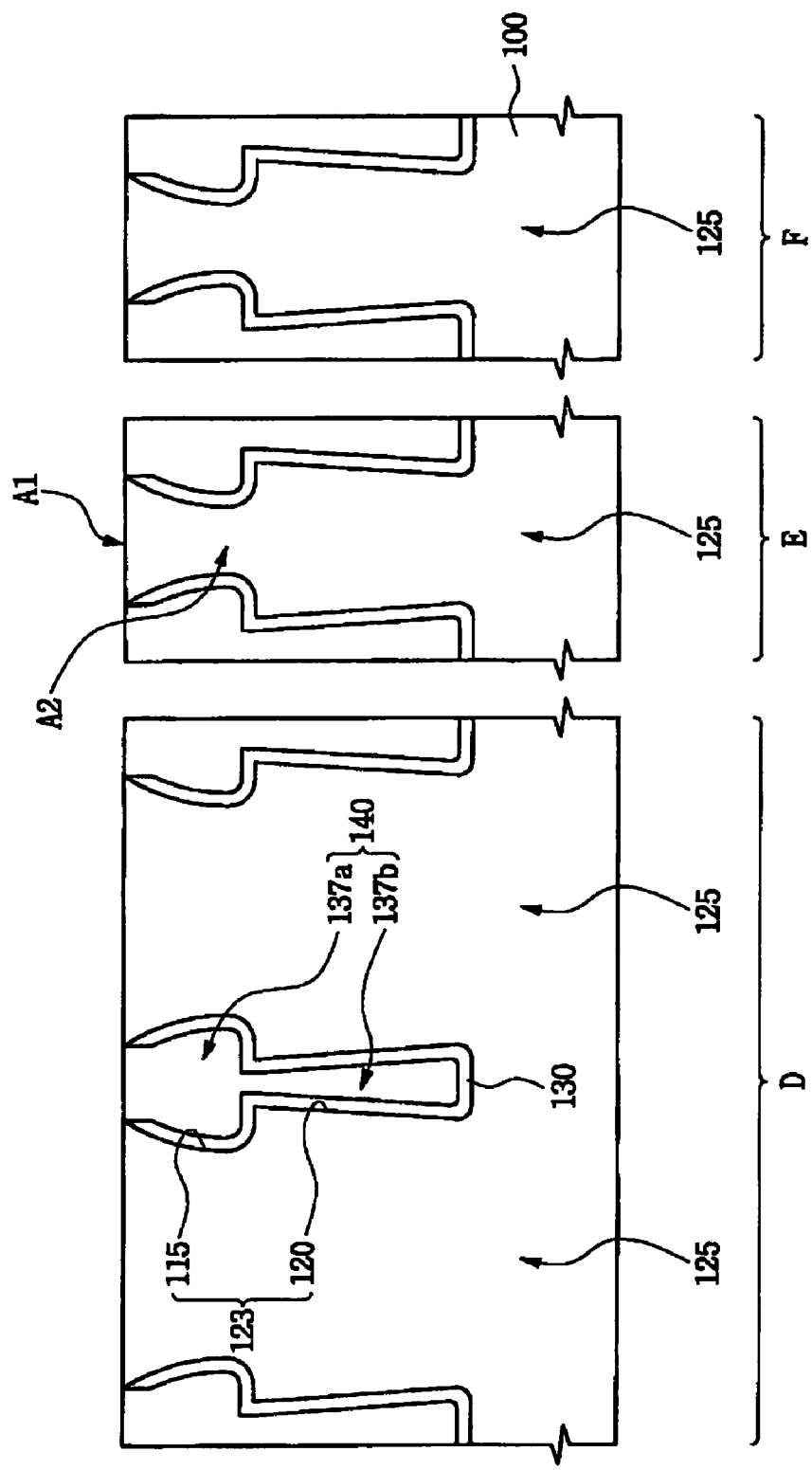
Figure 17A:
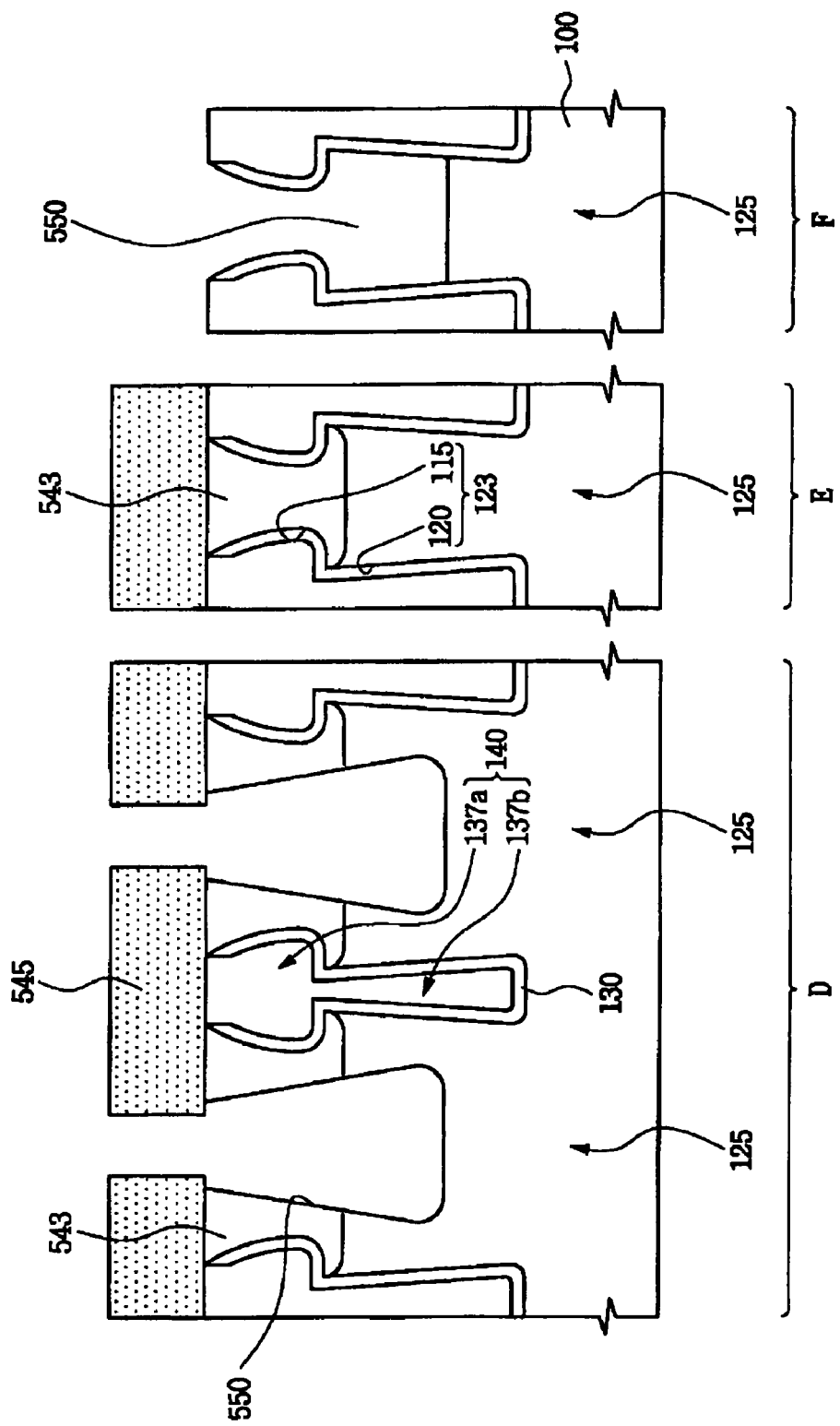
FIGS. 17A and 17B are cross-sectional views illustrating a semiconductor device in accordance with still another embodiment of the invention.
Figure 17B:
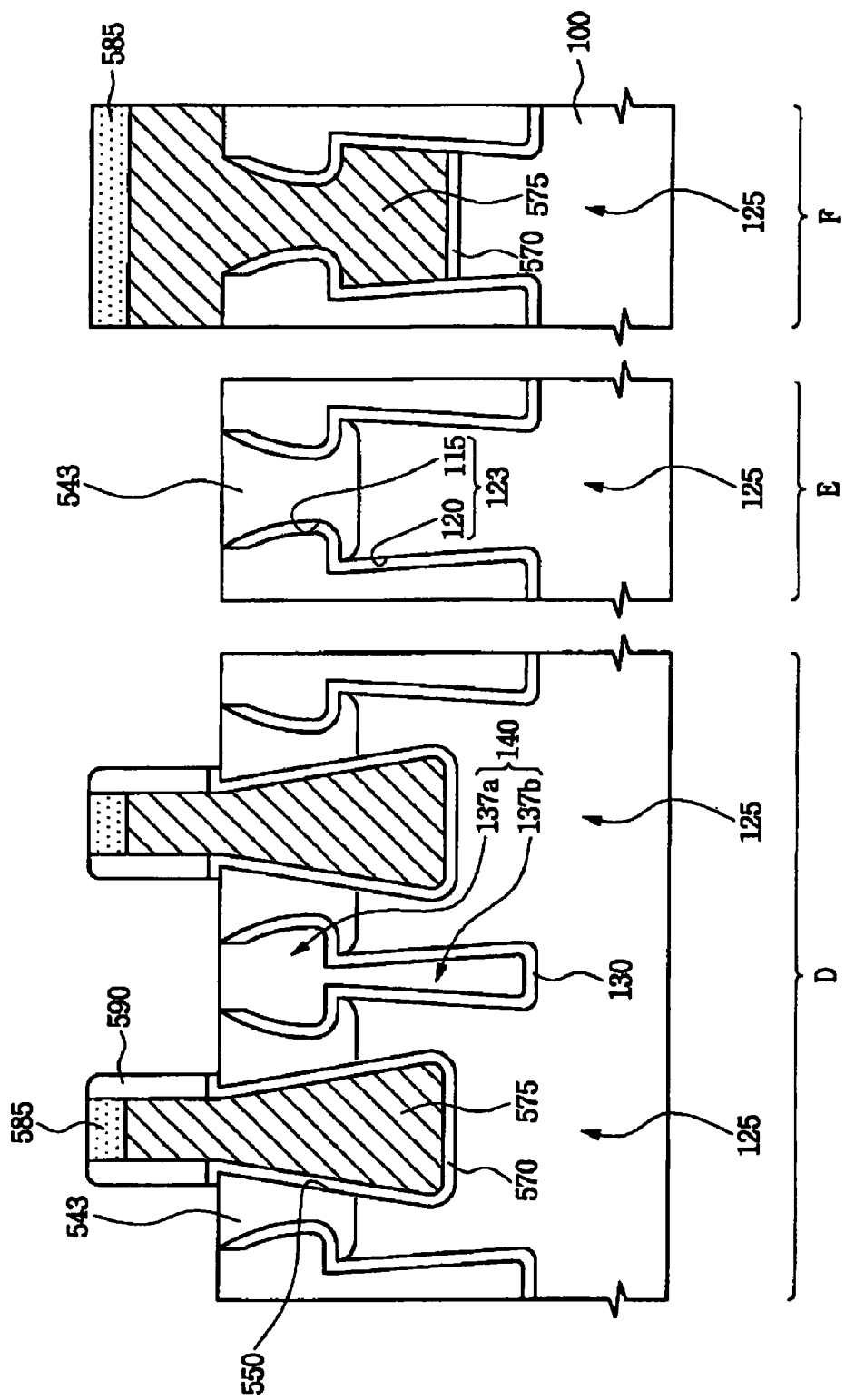
Figure 18A:
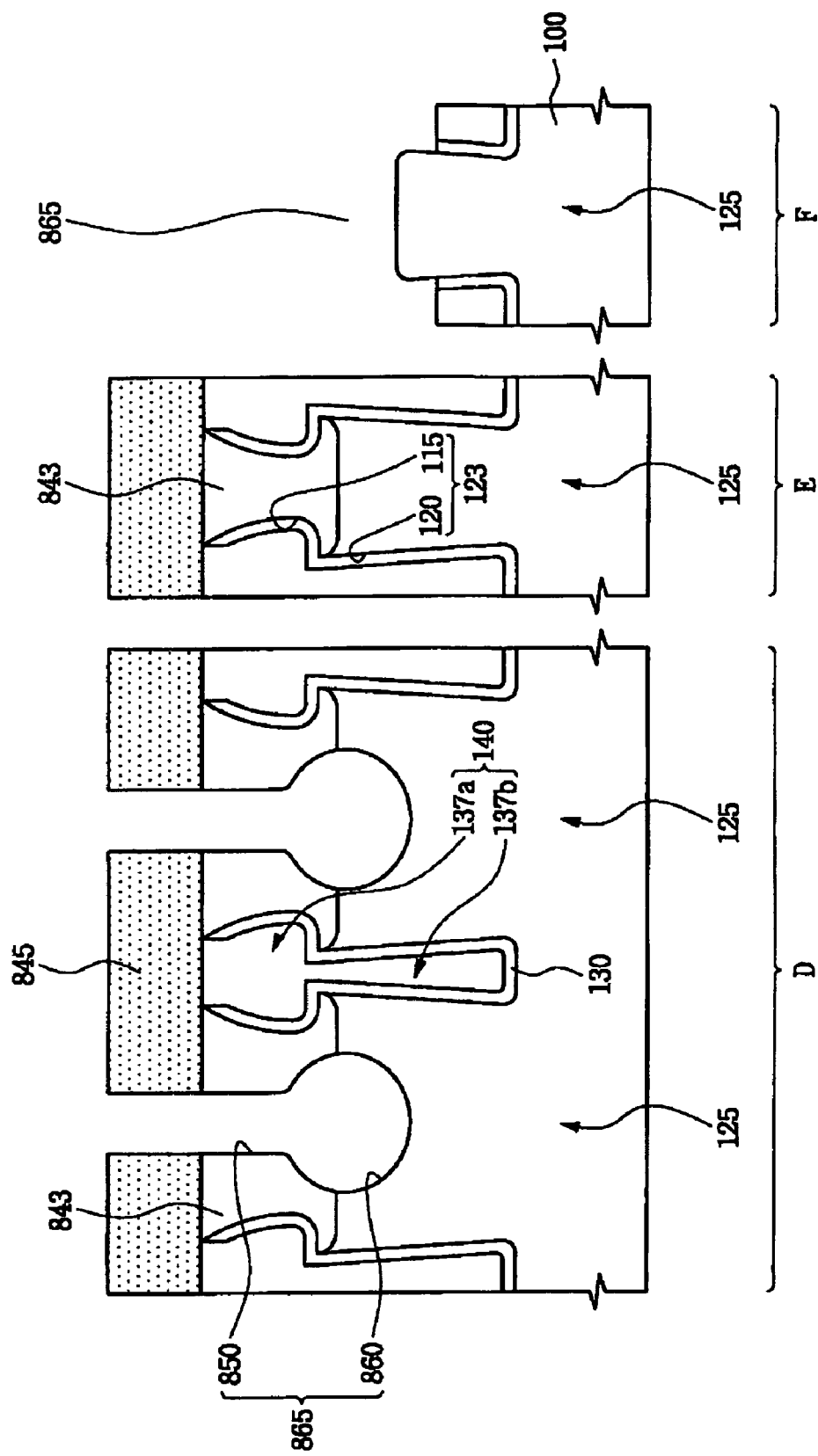
FIGS. 18A and 18B are cross-sectional views illustrating a semiconductor device in accordance with still another embodiment of the invention.
Figure 18B:
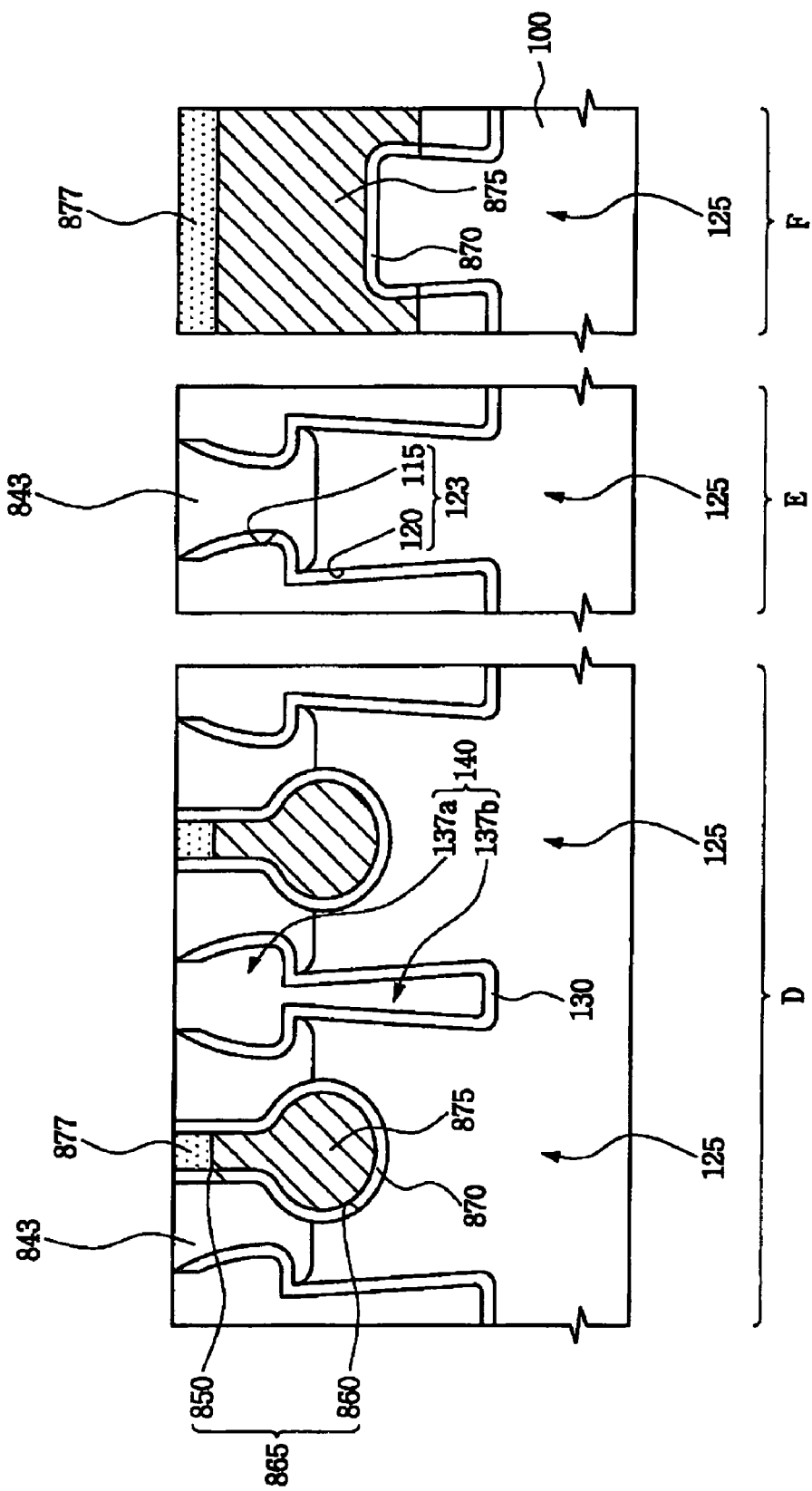

FIG. 15 is a plane view illustrating a semiconductor device in accordance with still another embodiment of the invention, FIGS. 16A and 16B are cross-sectional views illustrating a semiconductor device in accordance with still another embodiment of the invention, FIGS. 17A and 17B are cross-sectional views illustrating a semiconductor device in accordance with still another embodiment of the invention, FIGS. 18A and 18B are cross-sectional views illustrating a semiconductor device in accordance with still another embodiment of the invention, and FIGS. 19 A through 19D are cross-sectional views illustrating a semiconductor device in accordance with still another embodiment of the invention. Here, in FIGS. 16A through 19D, the reference number "D" illustrates a region taken along line III-III' of FIG. 15, the reference number "E" illustrates a region taken along line IV-IV' of FIG. 15, and the reference number "F" illustrates a region taken along line V-V' of FIG. 15.

An isolation region of a semiconductor device in accordance with the present invention will now be described with reference to FIGS. 16A and 16B.

A semiconductor substrate 100 may be provided. The semiconductor substrate 100 may be a silicon substrate. An isolation mask pattern 105 may be formed on the semiconductor substrate 100 so as to have an opening portion to expose a certain region of the semiconductor substrate 100. The isolation mask pattern 105 may include a silicon nitride layer or a combination layer in which thermal oxide layer and silicon nitride layer are stacked one after the other.

An upper isolation trench 115 is formed by etching the semiconductor substrate 100 by using the isolation mask pattern 105 as an etching mask. Here, the upper isolation trench 115 may have sidewalls of negative slope portions. The upper isolation trench 115 may be formed to extend downwardly. The upper isolation trench may be formed by etching the semiconductor substrate 100 using an anisotropic etching process and/or an isotropic etching process using the isolation mask pattern 105 as an etching mask. For example, the upper isolation trench 115 may be formed to have sidewalls of negative slope portions by performing an etching process with anisotropic etching process conditions using the isolation mask pattern 105 as an etching mask and performing an etching process with isotropic etching process conditions.

An isolation trench spacer 117 may be formed on the sidewalls of the upper isolation trench 115. The isolation trench spacer 117 may be formed of a material having an etching selectivity rate for the isolation mask pattern 105. For example, in case that the isolation mask pattern 105 is formed of a silicon nitride layer, the isolation trench spacer 117 may be formed of the silicon nitride layer.

A lower isolation trench 120 may be formed by etching a bottom region of the upper isolation trench 115 by using both the isolation mask pattern 105 and the isolation trench spacer 117 as an etching mask. Accordingly, an isolation trench structure 123 may be formed which includes the upper isolation trench 115 and the lower isolation trench 120. The lower isolation trench 120 may be formed to have sidewalls of negative slope portions, unlike the lower isolation trench 69 of FIG. 14. In other words, the lower isolation trench 120 may be formed in which an upper portion has a greater width than a lower portion. The lower isolation trench 120 may have a smaller width than the upper isolation trench 115. An active region 125 of the semiconductor substrate 100 may be defined by the isolation trench structure 123.

Referring to FIGS. 15 and 16B, the isolation trench spacer 117 may be removed. Next, a buffer insulating layer 130 may be formed on an inner sidewall of the isolation trench structure 123. The buffer insulating layer 130 may be formed to include a thermal oxide layer in order to cure any injury of the semiconductor substrate 100 resulting from the etching, while forming the isolation trench structure 123.

An isolation insulating layer 135 may be formed on the semiconductor substrate having the buffer insulating layer 130. The isolation insulating layer 135 may be formed to fill the isolation trench structure 123. For example, the isolation insulating layer 135 may be formed of a spin on glass (SOG) layer.

Meanwhile, the isolation insulating layer 135 may be formed of a silicon oxide layer by using a semiconductor processing technology such as chemical vapor deposition (CVD). The isolation insulating layer 135 may be formed to have voids therein, rather than completely filling the isolation trench structure 123.

The isolation insulating layer 135 may be planarized until the isolation mask pattern is exposed. Next, the isolation mask pattern 105 may be removed. Accordingly, a trench isolation region 140 remaining in the isolation trench structure 123 may be provided. The trench isolation region 140 may include an upper isolation region 137A filling the upper isolation trench 115 and a lower isolation region 137B filling the lower isolation trench 120.

Accordingly, since sidewalls of the upper isolation trench 115 may have negative slope portions, the upper isolation region 137A filling the upper isolation trench 115 may have sidewalls of positive slope portions. Further, since the lower isolation trench 120 may have sidewalls of either a vertical or a negative slope, the lower isolation region 137B filling the lower isolation trench 120 may have sidewalls of either a vertical or a positive slope. Further, since the sidewalls of the upper isolation region 137A may have positive slope portions, an upper active region of the active region 125 defined the upper isolation region 137A may have sidewalls of negative slope portions.

Accordingly, the upper active region of the active region 125 defined by the upper isolation region 137A may have a concave sidewall, at least in part. For example, the upper active region may be narrower and wider based on an upper surface as getting downwardly.

Referring to FIGS. 15, 17A and 17B, a semiconductor device in accordance with an exemplary embodiment of the present invention will be illustrated.

Referring to FIGS. 15 and 17A, a semiconductor substrate 100 may be provided as FIG. 16B. In other words, a semiconductor substrate 100 may be provided in which has a trench isolation region 140 defining an active region 125. an impurity region 543 having other conductivity than the active region 125 may be formed in the active region 125. The impurity region 543 may be formed to have a junction with the active region 125 at a lower level than the upper isolation region 137A.

A gate mask pattern 545 may be formed which has an opening portion traversing the active region 125. The opening portion of the gate mask pattern 545 may traverse the active region 125 and be extended to the trench isolation region 140. The gate mask pattern 545 may be formed of a material having an etching selectivity rate for the trench isolation region 140. For example, in case that the trench isolation region 140 is formed of a silicon oxide layer, the gate mask pattern 545 may be formed of a silicon nitride layer.

The active region 125 may be etched by using the gate mask pattern 545 as an etching mask. Consequently, a gate trench structure 550 may be formed which traverse the active region 125. Etching the active region using the gate mask pattern 545 as an etching mask may be carried out by using an anisotropic etching process and/or an isotropic etching process. The gate trench structure 550 may be disposed at a lower level than the upper isolation region 137A and may have a bottom region that is disposed at a higher level than the bottom region of the lower isolation region 137B. The gate trench structure 550 may be formed to have sidewalls of a negative slope. In other words, the gate trench structure 550 may be formed to have a wider width as getting from an upper region toward a lower region.

Meanwhile, an isotropic etching technology may be used in order to etch the active region 125 of a boundary region in which the upper isolation region 137A and the lower isolation region 137B contact each other, illustrated as a reference number "F". In other words, the active region 125 exposed by the opening portion may be etched by using an anisotropic etching technology using the gate mask pattern 545 as an etching mask, and the active region 125 of a boundary region in which the upper isolation region 137A and the lower isolation region 137B contact each other, illustrated as a reference number "F" may be etched by using an isotropic etching technology. Consequently, the gate trench structure 550 may be formed which traverse the active region 125. Here, a boundary region contacting sidewalls and a bottom region of the gate trench structure 550 may be formed to have a rounding in order to prevent transistors from degrading performance due to field enhancement effect.

Referring to FIGS. 15 and 17B, the gate mask pattern 545 may be removed. Next, a gate dielectric layer 570 may be formed on a semiconductor substrate having the gate trench structure 550. The gate dielectric layer 570 may be formed of either a silicon layer or a high-K dielectric layer whose dielectric constant is higher than the silicon layer. The gate dielectric layer 570 may be formed on sidewalls of the gate trench structure 550 and surface of the active region 125.

A conducting layer and a capping layer may be formed on the semiconductor substrate having the gate dielectric layer 570 one after the other. A gate electrode (G) 575 and a capping mask 585 stacked one after the other may be formed by patterning the conducting layer and the capping layer. Accordingly, the gate electrode (G) 575 may be formed to have a protrusion disposed at a higher level than the active region 125, while filling the gate trench structure 550 on the gate dielectric layer 570. The gate electrode (G) 575 may be formed to include a polysilicon layer. As an alternately, the gate electrode (G) 575 may be formed to include a metal layer, a metallic nitride layer or a metallic silicide layer. A gate spacer 590 may be formed on sidewalls of the gate electrode (G) 575 disposed at a higher level than the active region 125 and sidewalls of the capping mask 585.

Meanwhile, an impurity region 545 may be formed as illustrated in FIG. 17A, but it may not be limited thereto. For example, the impurity region 543 may be formed after forming the gate electrode (G) 575. In other words, the impurity region may be formed by activating impurity ions after introducing the impurity ions into the active region 125 adjacent to the gate electrode (G) 575 after forming the gate electrode (G) 575. Here, when the impurity ions are implanted and activated in the active region 125, the impurity ions may be diffused to the active region 125 adjacent to a boundary region between the upper isolation region 137A and the lower isolation region 137B. Meanwhile, the impurity region 543 may be formed before forming the trench isolation region 140.

In the semiconductor device formed as the above, a portion that the impurity region 543 and the gate electrode (G) 575 face each other may be deemed to a cross-sectional area of the impurity region 543 illustrated in a reference number "E" of FIG. 17B. The impurity region 543 illustrated in a reference number "E" of FIG. 17B may be formed narrower as it comes from an upper surface toward downward. Accordingly, the region that the impurity region 543 and the gate electrode (G) 575 face each other may be minimized while not reducing an upper surface area of the impurity region 543. Consequently, gate induced drain leakage (GIDL) current may be minimized while not degrading a source/drain contact resistance characteristics.

Meanwhile, the lower isolation region 137B may have substantially vertical sidewalls, or sidewalls having a slope in which a width gets wider from an upper region toward a lower region. Accordingly, the active region 125 disposed at a similar level as the lower isolation region 137B may have vertical sidewalls or sidewalls having a negative slope. Accordingly, since the active region 125 disposed below the gate electrode 575 has a shape of being substantially narrower in comparison with an active region in which have sidewalls having a positive slope, a depletion region may be reduced which is formed at the active region 125 below the gate electrode 575. Consequently, transistors having improved swing characteristics may be provided.

Next, referring to FIGS. 15, 18A and 18B, a semiconductor device in accordance with other exemplary embodiment of the present invention will be illustrated.

Referring to FIGS. 15 and 18A, a semiconductor substrate 100 may be provided as illustrated in FIG. 16B. In other words, the semiconductor substrate 100 may be provided in which has a trench isolation region 140 defining an active region 125. An impurity region 843 having different conductivity than the active region 125 may be formed in the active region 125. The impurity region 843 may be formed to have a junction with the active region 125 at a lower level than the upper isolation region 137A. A gate mask pattern 845 may be formed which has an opening portion traversing the active region 125. The opening portion of the gate mask pattern 845 may traverse the active region 125 and be extended to the trench isolation region 140.

The active region 125 the trench isolation region 140 may be etched by using the gate mask pattern 545 as an etching mask. Consequently, a gate trench structure 865 may be formed which traverse the active region 125 and is extended to the trench isolation region 140. Forming the gate trench structure 865 may include forming an upper gate trench 865 traversing the active region 125, and forming a lower gate trench 860 having a wider width than the upper gate trench 850 below the upper gate trench 850.

Meanwhile, the gate trench structure 865 may partially expose sidewalls of the active region 125. In other words, the active region 125 is exposed by using the gate mask pattern 845 as an etching mask, and the sidewalls of the active region 125 may be exposed by etching the trench isolation region 140 deeper than the active region 125. Accordingly, the gate trench structure 865 may be formed in which a bottom region of a portion extended to the trench isolation region 140 may be disposed at lower level than a bottom region of a portion traversing the active region 125.

Meanwhile, the active region 125 exposed by the gate trench structure 865 may be formed to have a rounding shape rather than a sharp shape at edge portions. For example, the gate trench structure 865 is formed by etching both the active region 125 and the trench isolation region 140 using the gate mask pattern 845 as an etching mask, and sharp shape of edge portions of the active region 125 may be treated to make rounding by using an isotropic etching technology.

Referring to FIGS. 15 and 18B, the gate mask pattern 845 may be removed. Next, a gate dielectric layer 870 may be formed on a semiconductor substrate having the gate trench structure 865. A gate electrode 875 buried in by the gate trench structure 865 may be formed on the gate dielectric layer 875. In case that the gate electrode 875 buried as above partially fills the gate trench structure 850, an insulating pattern 877 may be formed on the gate electrode 875.

Meanwhile, in case that the sidewalls of the active region are exposed while the gate trench structure 865 is formed in which a bottom region of a portion extended to the trench isolation region 140 is disposed at lower level than a bottom region of a portion traversing the active region 125, the gate electrode 875 may cover the sidewalls of the active region 125. Accordingly, it can prevent transistors from degrading performance due to a body effect.

Meanwhile, it is not illustrated in figures, but the gate electrode may be formed in which is disposed at higher level than the active region 125 and fills the gate trench structure 865, after forming the gate dielectric layer 870.

Meanwhile, the impurity region 843 may be formed as illustrated in FIG. 18A, but it may not be limited thereto. For example, the impurity region 843 may be formed after forming the gate electrode 875.

According to the present invention, while not reducing an upper surface area of the impurity region 843 defining a source/drain region, a region may be minimized which the impurity region 843 and the gate electrode 875 face each other. Accordingly, a leakage current may be minimized while not degrading a source/drain contact resistance characteristics. As a result, a transistor performance may be improved. Further, when such a transistor is employed in a cell transistor of semiconductor devices such as dynamic random access memories (DRAM), the refresh characteristics of the semiconductor device such as DRAM may be much improved.

Next, referring to FIGS. 15, 19A through 19D, a trench isolation region in accordance with other exemplary embodiment of the present invention will be illustrated.

Figure 19A:
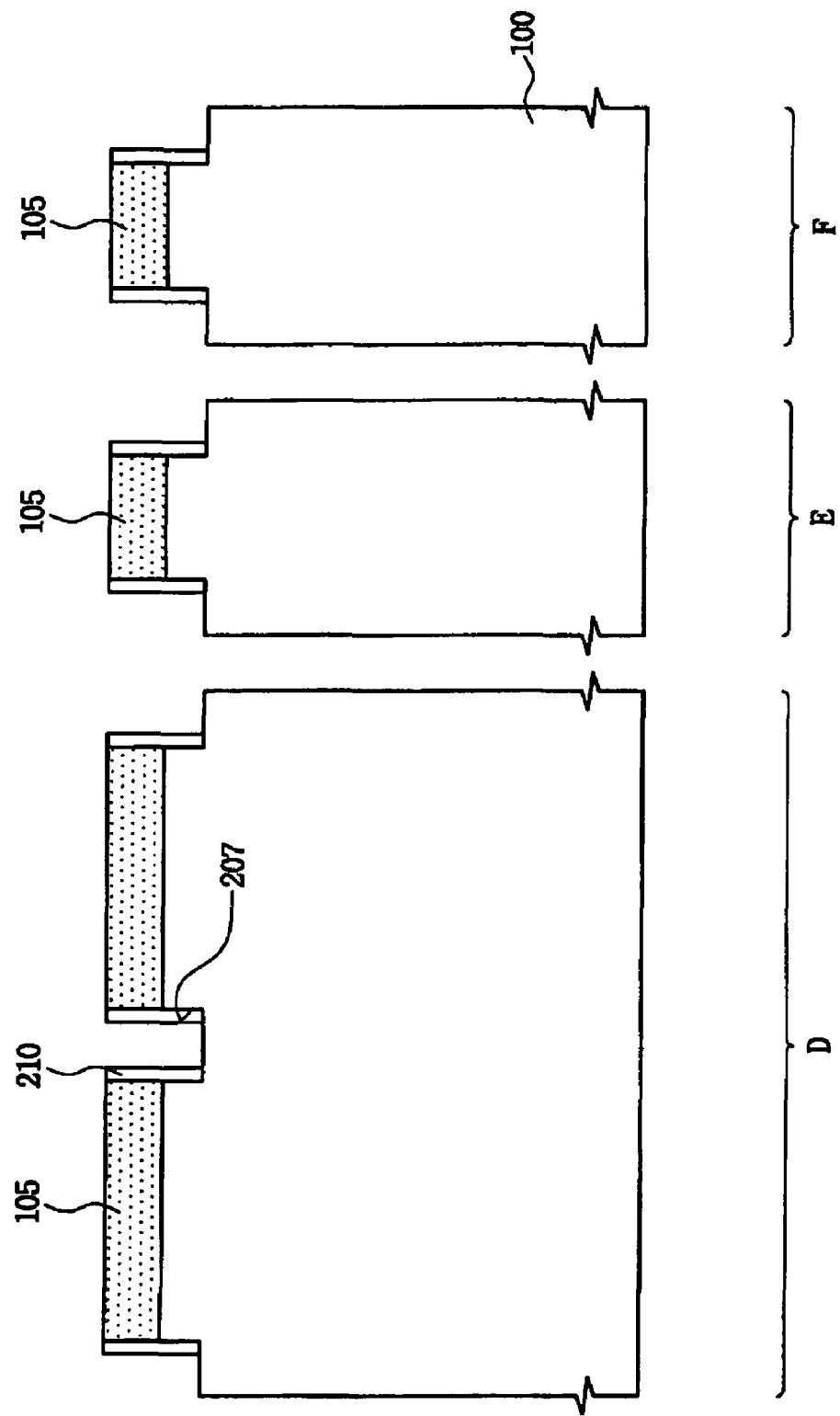
FIGS. 19 A through 19D are cross-sectional views illustrating a semiconductor device in accordance with still another embodiment of the invention.

Referring to FIGS. 15 and 19A, an isolation mask pattern 105 may be formed on a semiconductor substrate 100 as illustrated in FIG. 16A. Next, a preliminary trench 207 may be formed by anisotropically etching the semiconductor substrate 100 using the isolation mask pattern 105 as an etching mask. A preliminary trench spacer 210 may be formed on sidewalls of the preliminary trench 207 and sidewalls of the isolation mask pattern 105. The preliminary trench spacer 210 may be formed of a material having an etching selectivity rate for the isolation mask pattern 105. For example, in case that the isolation mask pattern 105 is formed of a silicon nitride layer, the preliminary trench spacer 210 may be formed of the silicon oxide layer.

Figure 19B:
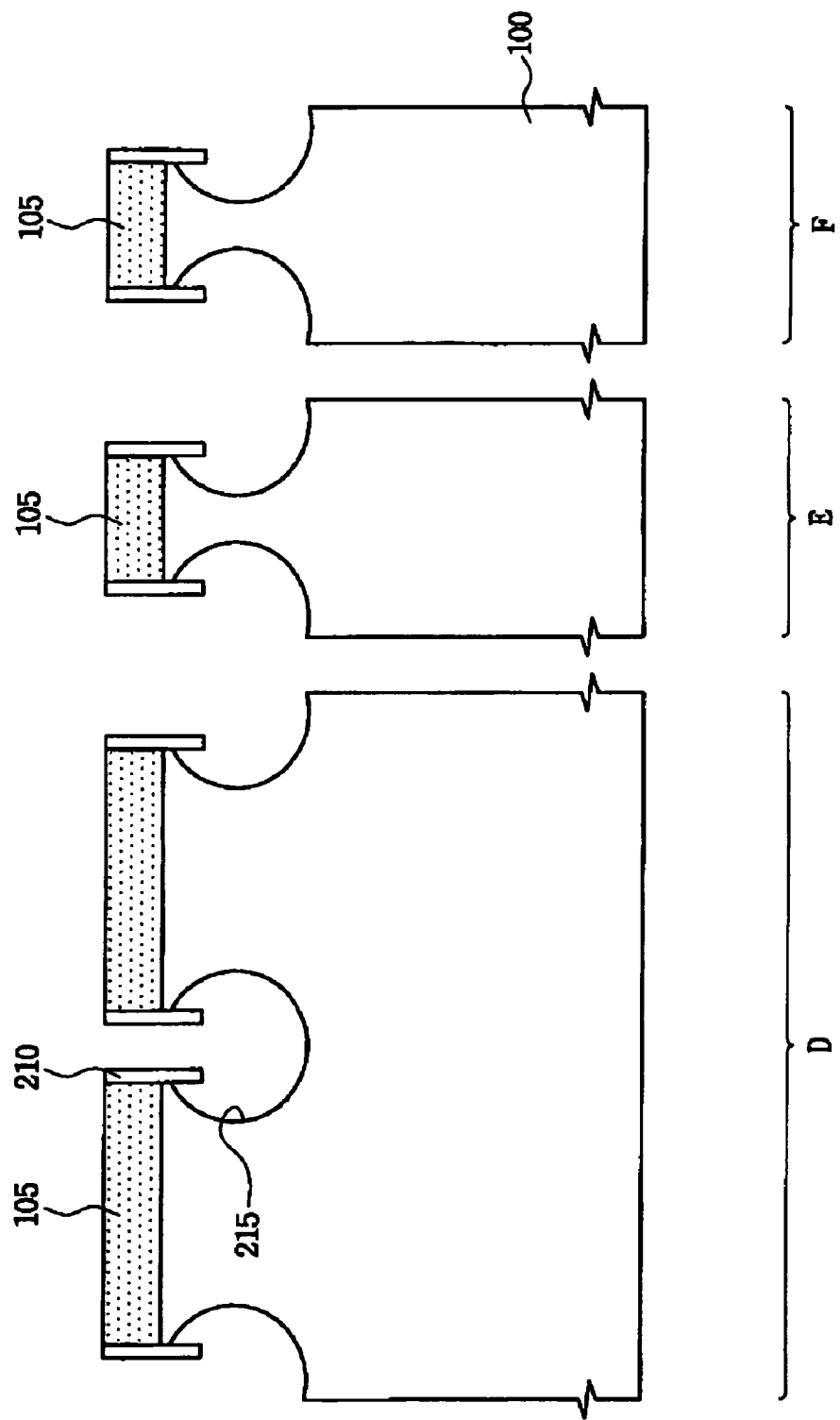

Referring to FIGS. 15 and 19B, an upper isolation trench 215 may be formed by isotropically etching the semiconductor substrate 100 using both the isolation mask pattern 105 and the preliminary trench spacer 210 as an etching mask. The upper isolation trench 215. The upper isolation trench 215 may have sidewalls having rounding portions. Accordingly, the upper isolation trench 215 may include sidewall having a negative slope.

Figure 19C:
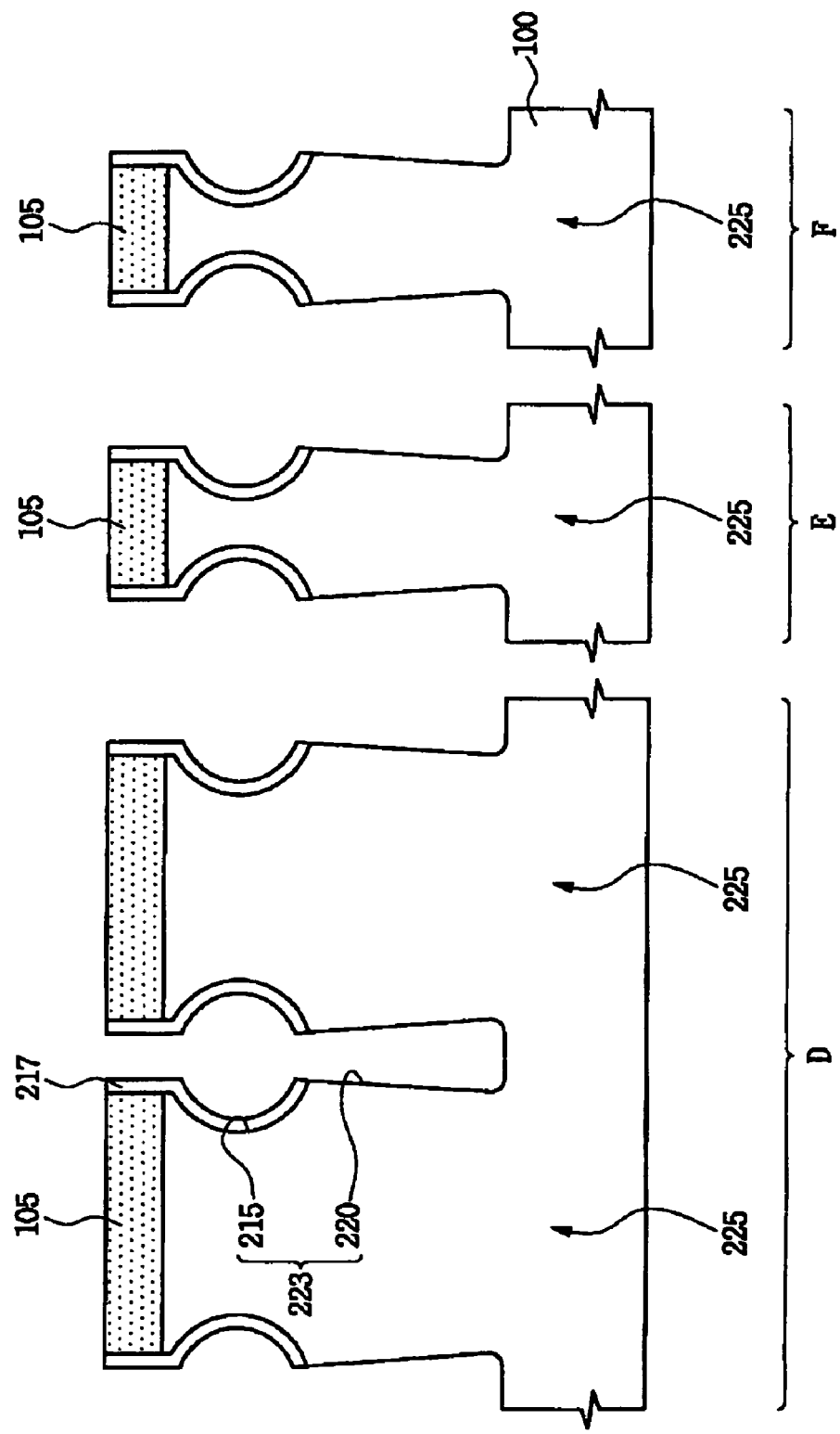

Referring to FIGS. 15 and 19C, the preliminary trench spacer 210 may be removed. Next, an isolation trench spacer 217 may be formed on the sidewalls of the upper isolation trench 215 and the sidewalls of the isolation mask pattern 105. More specifically, forming the isolation trench spacer 217 may include forming a spacer insulating layer on the semiconductor substrate having the upper isolation trench 215 and anistopically etching the spacer insulating layer. The isolation trench spacer 217 may be formed of a silicon oxide layer.

A lower isolation trench 220 having a narrower width than the upper isolation trench 215 may be formed by etching a bottom region of the upper isolation trench 215 using both the isolation trench spacer 217 and the isolation mask pattern 105 as an etching mask. The lower isolation trench 220 may be formed with sidewalls having a substantially vertical profile. Meanwhile, the lower isolation trench 220 may be widened from its upper portion to its lower portion. Accordingly, the lower isolation trench 220 may form an isolation trench structure 223 defining an active region 225 of the semiconductor substrate 100 with the upper isolation trench 215.

Referring to FIGS. 15 and 19D, the isolation trench spacer 217 may be removed. Next, a buffer insulating layer 230 may be formed on an inner sidewall of the isolation trench structure 223. The buffer insulating layer 230 may be formed to include a thermal oxide layer in order to cure any injury of the semiconductor substrate 100 resulting from the etching, while forming the isolation trench structure 223. Next, an isolation insulating layer may be formed on the semiconductor substrate having the buffer insulating layer 230, and the isolation insulating layer may be planarized until a top surface of the isolation mask pattern 105 is exposed. Next, the isolation mask pattern 105 may be removed. Accordingly, a trench isolation region 240 filling the isolation trench structure 223 may be formed on the buffer insulating layer 230. The trench isolation region 240 may include an upper isolation region 237A filling the upper isolation trench 215 and a lower isolation region 237B filling the lower isolation trench 220.

The trench isolation region 240 may be formed to have sidewalls of a shape corresponding to the sidewalls of the isolation trench structure 223 so as to fill the isolation trench structure 223. In other words, since sidewalls of the upper isolation trench 215 may be formed to have negative slope portions, the upper isolation region 237A may have sidewalls having positive slope portions. Accordingly, when the upper isolation trench 215 is formed to have sidewalls of a rounding shape, the upper isolation region 237A may be formed to have sidewalls of a convexly rounding shape. The upper isolation region 237A may be formed in which a center portion of the sidewalls has a convex shape. As such, when the lower trench trench 220 is formed to have either vertical sidewalls or sidewalls having a negative slope, the lower isolation region 237B may be formed to have either vertical sidewalls or sidewalls having a positive slope.

Accordingly, the active region 225 defined by the isolation trench structure 233, in other words, by the trench isolation region 240 may have sidewalls of a shape corresponding to the sidewalls of the isolation trench structure 233. In other words, when the upper isolation region 237A is formed to have convex sidewalls, the active region 225 may be defined to have a concave sidewall at a similar portion as the upper isolation region 237A is disposed. Further, when the lower isolation region 237B is formed to have vertical sidewalls or sidewalls of a positive slope, the active region 225 may be defined to have vertical sidewalls or sidewalls of a negative slope at a similar portion as the lower isolation region 237B is disposed.

As described above, the trench isolation region 240 may comprise the upper isolation region 237A and the lower isolation region 237B. The active region 225 defined by the trench isolation region 240 may be narrower and wider as it comes from a top surface downwardly. As illustrated in FIG. 19D, a method forming a transistor having a recess channel region in the active region 225 and a structure of the transistor thereof may be substantially similar to the method and the structure illustrated in FIGS. 16 through 18, so explanation will be omitted.

Figure 20A:
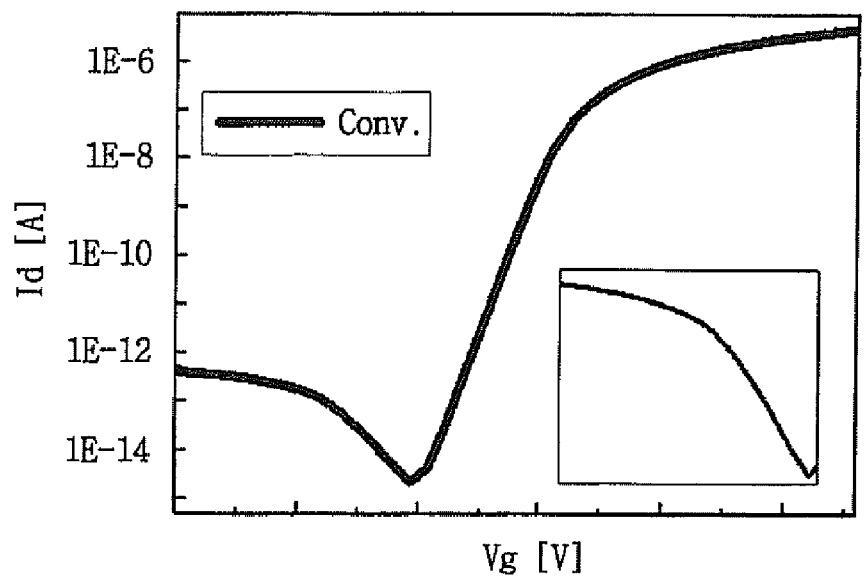
FIGS. 20A, 20B, 20C, 21A, 21B, 22A and 22B are various graphs and plots presenting comparative performance information between a conventional transistor and one designed and fabricated in accordance with an embodiment of the invention.
Figure 20B:
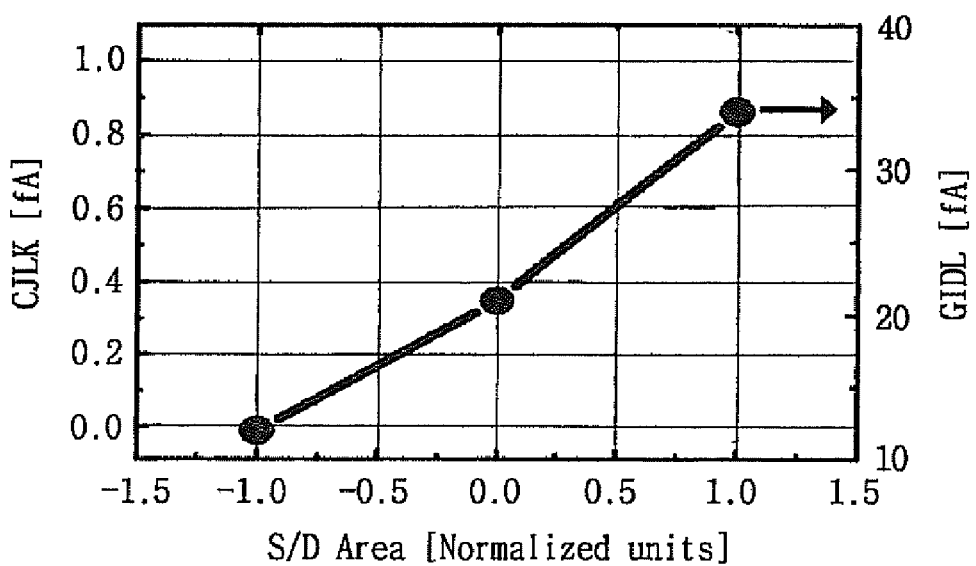
Figure 20C:
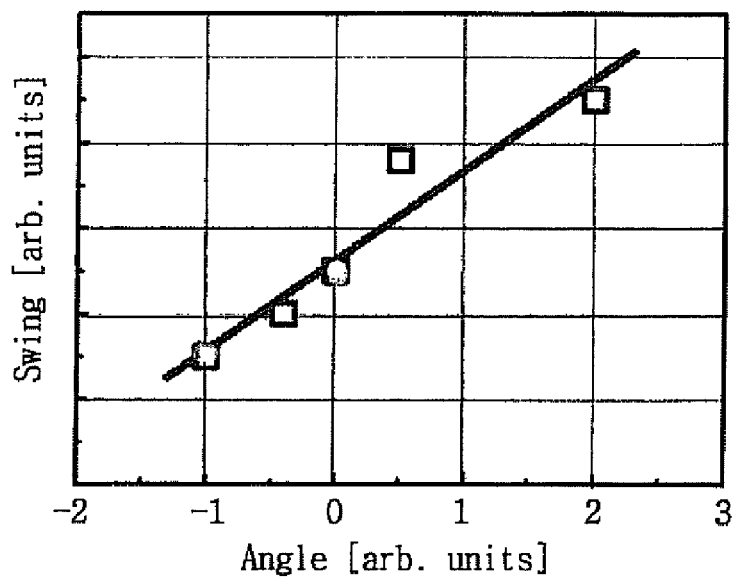

The laterally extended RCAT incorporating laterally reduced source/drain structure per the foregoing embodiment of the invention affords marked performance improvements over conventional planar transistors and even conventional RCATs. For example, current leakage and in particular GIDL properties between a conventional ("Conv.") transistor and an exemplary transistor designed and fabricated in accordance with an embodiment of the invention ("LatEx") are compared in FIGS. 20A and 20B. Resulting improvements in swing, an operating speed metric, are illustrated in FIG. 20C.

Figure 21A:
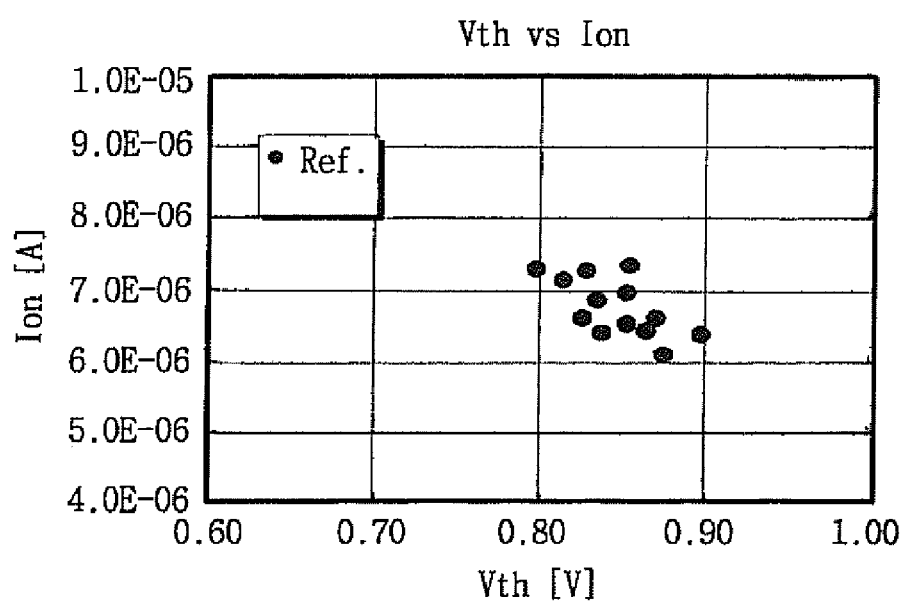
Figure 21B:
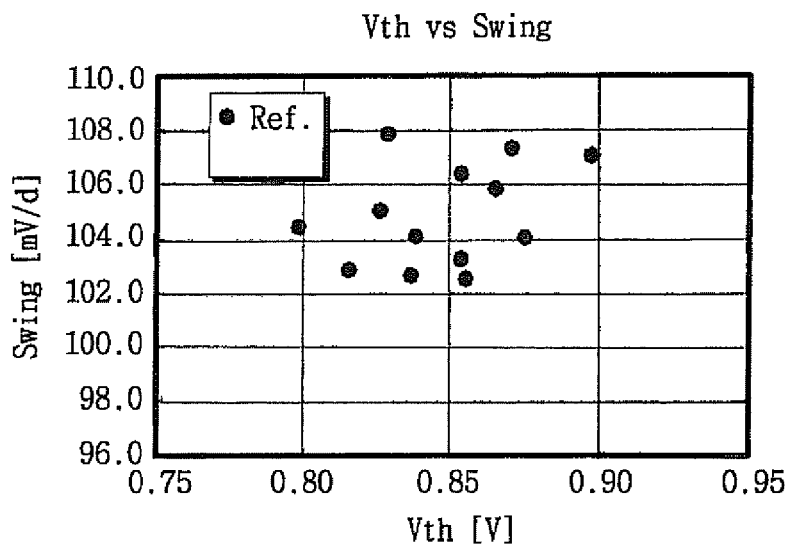

Additionally, FIG. 21A illustrates the difference between ON-state current (ion) as a function of transistor threshold voltage (Vth) for the conventional transistor ("Ref.") and a transistor designed and fabricated in accordance with an embodiment of the invention ("LatEx"). Analogously, FIG. 21B illustrates comparative relationships between swing and transistor threshold voltage.

Figure 22A:
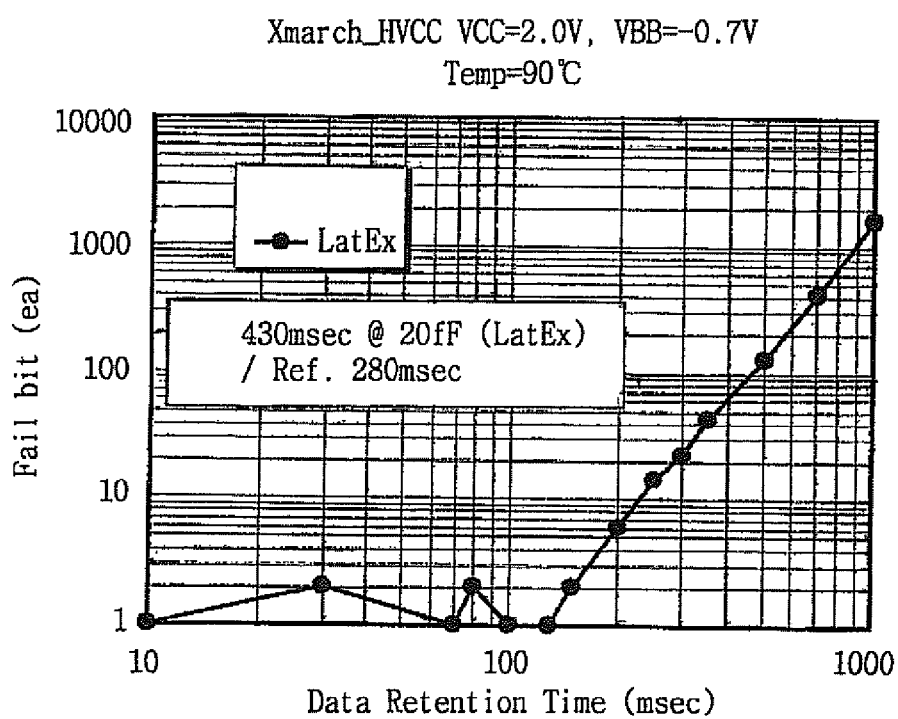
Figure 22B:
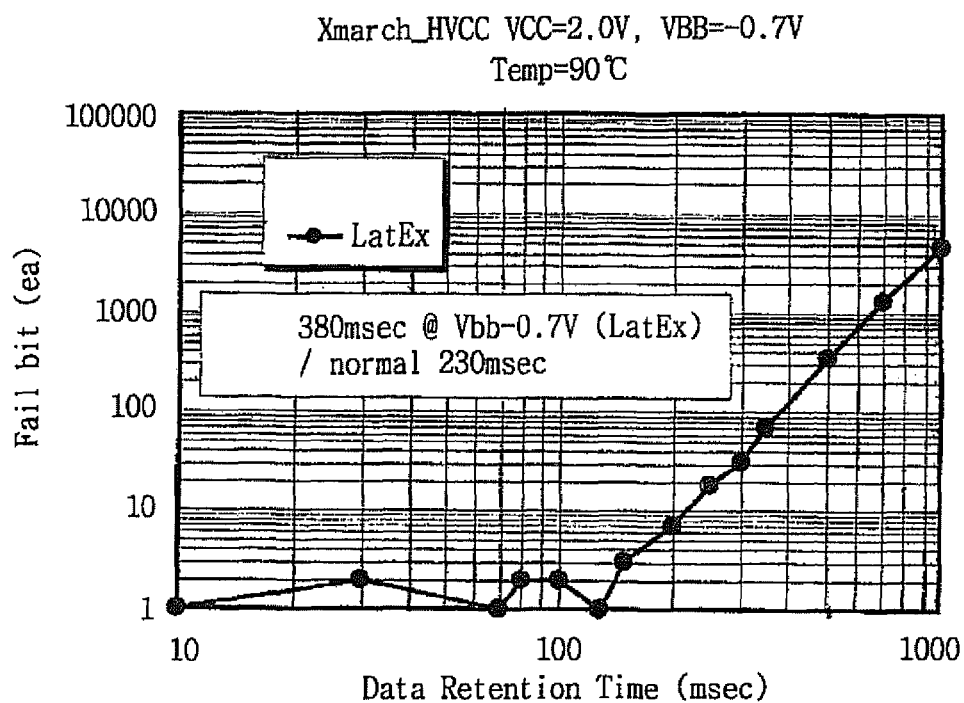

Finally, fail bit performance as a function of data retention time for memory devices respectively incorporating the conventional transistor ("Ref") and a transistor designed and fabricated in accordance with an embodiment of the invention ("LatEx") are illustrated in FIGS. 22A and 22B. Clearly, the exemplary embodiment of the invention provides improved data retention ability within a model memory circuit.

The embodiment of the invention described in relation to FIGS. 14, 16b and 19d provides an upper isolation trench having, at least in part, negative sidewall profiles formed, for example, by wet etching or dry isotropic etching. Compared with upper isolation trenches having linear sidewalls formed, for example by anisotropic etching, the illustrated embodiment markedly reduces the contact area between source/drain regions, thereby reducing GIDL. The illustrated embodiment also includes a lower isolation trench region having substantially linear (and substantially vertical) sidewalls formed in a bottom surface of the upper isolation trench. Thus formed, the lower isolation trench enlarges the effective channel width, thereby allowing higher drive current to be obtained. Consequently, a transistor having a relatively large effective channel width but relatively small planar footprint may be implemented with reduced GIDL.

Figure 23:
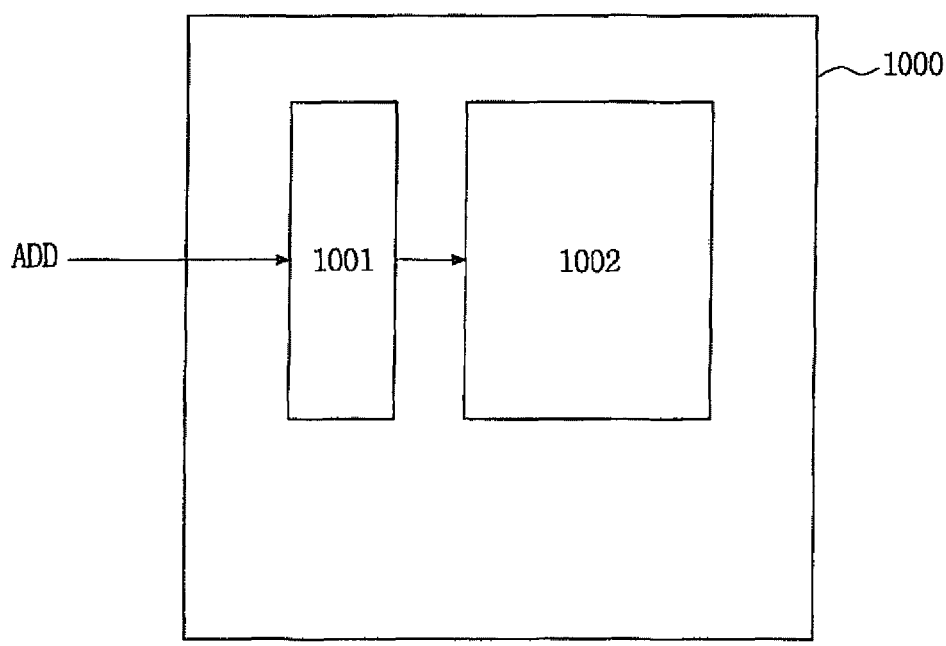
FIG. 23 is a general block diagram of a memory system susceptible to incorporation of one or more transistors designed and fabricated in accordance with an embodiment of the invention.

As such, transistors formed in accordance with an embodiment of the invention are particularly well suited (but by no means exclusively ascribed) to incorporation within semiconductor memory devices. For example, considering the general block diagram of FIG. 23 a semiconductor memory device 1000 includes a decoder 1001 selecting one or more unit memory cells in a memory cell array 1002 in response to a address signal (ADD) received from a controller. Each unit memory cell within memory array 1002 may comprises one or more transistors formed in accordance with an embodiment of the invention. Similarly, well understood peripheral circuits like decoder 1001 may include one or more transistors formed in accordance with an embodiment of the invention.

The embodiments described above have been drawn to SRCAT examples. However, the benefits of the invention are not limited to only SRCATs. At a minimum, the scope of the invention extends to all transistors having a structure including a recessed gate. The particular geometry defining the recessed gate structure may vary between embodiments of the invention.

Many alterations and modifications may be made by those having ordinary skill in the art, given the benefit of the present disclosure without departing from the scope of the invention. Therefore, it should be understood that the illustrated embodiments have been set forth as examples of the invention defined by the following claims.

What is claimed is:

1. A transistor disposed on a substrate in relation to an isolation region, the transistor comprising:
    a gate electrode and associated source/drain regions,
    wherein the isolation region is disposed in the substrate to define an active region, the isolation region including an upper isolation region defining an upper active region and an lower isolation region defining a lower active region, wherein the upper isolation region is formed with sidewalls having, at least in part, a positive slope profile, such that a width of an upper mouth portion of the upper isolation region is less than or equal to a width of a lower sidewall portion of the upper isolation region, and the lower isolation region is formed with smoothly curved concaved sidewalls;
    the gate electrode extends through the upper active region into the lower active region; and
    the source/drain regions are disposed in the active region on respective sides of the gate electrode.

2. The transistor of claim 1, wherein the upper active region has, at least in part, a concave sidewall.

3. The transistor of claim 1, wherein the isolation region is filled with an insulating material, wherein the insulating material comprises:
    a first insulating material formed on sidewalls of the upper isolation region; and
    a second insulating material filling a center portion of the upper isolation region between the first insulating material, and filling the lower isolation region.

4. The transistor of claim 3, wherein the insulating material includes at least one void formed in is material structure, wherein the at least one void enhances the insulating nature of the insulating material.

5. The transistor of claim 1, wherein the lower active region has a width greater than the upper active region.

6. The transistor of claim 1, wherein the width of the lower isolation region is less than a minimal width of the upper isolation region.

7. A semiconductor memory device comprising:
    an array of memory cells and at least one peripheral circuit associated with the array, wherein each memory cell in the array comprises at least one lateral extended transistor, the lateral extended transistor comprising a gate electrode and associated source/drain regions,
    wherein each memory cell in the array is formed in an active region of a substrate defined by an isolation region, the isolation region including an upper isolation region defining an upper active region and an lower isolation region defining a lower active region, wherein the lower isolation region is formed with smoothly curved concaved sidewalls;
    the gate electrode extends through the upper active region into the lower active region; and,
    the source/drain regions are disposed in the active region on respective sides of the gate electrode.

8. The semiconductor memory devices of claim 7, further comprising a decoder circuit receiving an address signal and selecting one or more of the memory cells in the array in response to the address signal.

* * * * *